United States Patent
Hamanaka et al.

(10) Patent No.: US 8,089,077 B2
(45) Date of Patent: Jan. 3, 2012

(54) LIGHT-EMITTING ELEMENT ARRAY WITH MICRO-LENSES AND OPTICAL WRITING HEAD

(75) Inventors: Kenjiro Hamanaka, Minato-ku (JP);
Takahiro Hashimoto, Minato-ku (JP)

(73) Assignee: Fuji Xerox Co., Ltd., Tokyo (JP)

( * ) Notice: Subject to any disclaimer, the term of this patent is extended or adjusted under 35 U.S.C. 154(b) by 89 days.

(21) Appl. No.: 12/296,234

(22) PCT Filed: Feb. 21, 2007

(86) PCT No.: PCT/JP2007/053202
§ 371 (c)(1),
(2), (4) Date: Aug. 10, 2009

(87) PCT Pub. No.: WO2007/113947
PCT Pub. Date: Oct. 11, 2007

(65) Prior Publication Data
US 2010/0001296 A1    Jan. 7, 2010

(30) Foreign Application Priority Data
Apr. 4, 2006 (JP) ................. 2006-102829

(51) Int. Cl.
*H01L 29/18* (2006.01)
*H01L 33/00* (2010.01)
*H01L 29/207* (2006.01)
*H01L 27/146* (2006.01)

(52) U.S. Cl. ........... 257/88; 257/93; 257/98; 257/99; 257/100; 257/443; 257/910; 257/911; 257/918; 257/E31.095; 257/E33.068; 257/E33.073

(58) Field of Classification Search ............. 257/88, 257/91, 93, 443, 446, 448, 459, 784, 98, 257/99, 100, 910, 911, 918, E33.068, E33.073, 257/E33.095
See application file for complete search history.

(56) References Cited

U.S. PATENT DOCUMENTS
4,040,078 A * 8/1977 Eckton et al. ............. 250/551
(Continued)

FOREIGN PATENT DOCUMENTS
JP      51-110984    9/1976
(Continued)

OTHER PUBLICATIONS

Microfilm of the specification and drawings annexed to the request to Japanese Utility Model Application No. 051084/1987 (Laid-open No. 157963/1988), Oct. 17, 1988, Fig. 7.
(Continued)

*Primary Examiner* — Minh-Loan T Tran
*Assistant Examiner* — Teresa M. Arroyo
(74) *Attorney, Agent, or Firm* — RatnerPrestia

(57) ABSTRACT

A light-emitting element array with the improvement of the light-emitting efficiency and the improvement of the uneven amount of light is provided.
A light-emitting element array comprises a light-emitting portion array consisting of a plurality of light-emitting portions linearly arranged in a main scanning direction, and a micro-lens formed on each of the light-emitting portions, wherein the micro-lens has a shape of the length of a sub-scanning direction different from the length of the main scanning direction, and the length of the sub-scanning direction is longer than the length of the main scanning direction, and is 3.5 times or less of the length of the main scanning direction.

9 Claims, 18 Drawing Sheets

U.S. PATENT DOCUMENTS

| | | | |
|---|---|---|---|
| 4,047,075 A | | 9/1977 | Schoberl |
| 4,733,335 A | * | 3/1988 | Serizawa et al. ............. 362/503 |
| 4,734,734 A | | 3/1988 | Yano |
| 4,935,665 A | * | 6/1990 | Murata ......................... 313/500 |
| 5,001,944 A | | 3/1991 | Ogawa et al. |
| 5,291,038 A | * | 3/1994 | Hanamoto et al. ............. 257/82 |
| 5,847,745 A | * | 12/1998 | Shimizu et al. ............... 347/227 |
| 6,485,994 B1 | * | 11/2002 | Ohno ............................ 438/22 |
| 6,583,444 B2 | * | 6/2003 | Fjelstad ......................... 257/82 |
| 2005/0067944 A1 | | 3/2005 | Masuda et al. |
| 2005/0274959 A1 | * | 12/2005 | Kim et al. ...................... 257/79 |
| 2006/0001731 A1 | | 1/2006 | Nakamura et al. |
| 2006/0012888 A1 | | 1/2006 | Hashimoto et al. |
| 2006/0065957 A1 | * | 3/2006 | Hanya ........................... 257/676 |
| 2007/0109395 A1 | * | 5/2007 | Watanabe et al. ............. 347/238 |

FOREIGN PATENT DOCUMENTS

| | | |
|---|---|---|
| JP | 51110984 | 9/1976 |
| JP | 61-177475 | 9/1986 |
| JP | 61177475 | 9/1986 |
| JP | 2577089 | 7/1996 |
| JP | 09102631 A * | 4/1997 |
| JP | 09-186367 | 7/1997 |
| JP | 09 187991 | 7/1997 |
| JP | 09186367 | 7/1997 |
| JP | 09187991 | 7/1997 |
| JP | 2002-164579 | 6/2002 |
| JP | 2002164579 | 6/2002 |
| JP | 2003-170625 | 6/2003 |
| JP | 2004-209703 | 7/2004 |
| JP | 2005-039195 | 2/2005 |
| JP | 2005-159773 | 6/2005 |
| JP | 2005-175417 | 6/2005 |
| JP | 2005159773 | 6/2005 |
| JP | 2005175417 | 6/2005 |
| JP | 2005-311269 | 11/2005 |
| JP | 2005311269 | 11/2005 |
| JP | 2006-032448 | 2/2006 |
| JP | 2006032448 | 2/2006 |
| WO | 2004039595 | 5/2004 |
| WO | WO 2004/039595 | 5/2004 |

OTHER PUBLICATIONS

Microfilm of the specification and drawings annexed to the request to Japanese Utility Model Application No. 131573/1988 (Laid-open No. 052463/1990), Apr. 16, 1990; p. 4, lines 6 to 19; p. 7 Lines 7 to 15, Figs 1, 2.

Microfilm of the specification and drawings annexed to the request to Japanese Utility Model Application No. 162538/1988 (Laid-open No. 082541/1990), Jun. 26, 1990.

International Search Report May 15, 2007.

* cited by examiner

PRIOR ART

PRIOR ART

PRIOR ART

PRIOR ART

PRIOR ART

LIGHT-EMITTING ELEMENT ARRAY WITH MICRO-LENSES AND OPTICAL WRITING HEAD

This is a 371 U.S. National Phase Application of PCT application no. PCTJP2007053202 the contexts of which are expressly incorporated by reference herein.

TECHNICAL FIELD

The present invention relates to a light-emitting element array and an optical writing head, and in particular, relates to a light-emitting element array with micro-lenses that improves amount of light.

RELATED ART

It is known that a light-emitting element array and an optical writing head are used as a source of light to expose light to a cylindrical photosensitive drum comprised in an optical printer, a facsimile or an electro-photographic apparatus (for example, it is disclosed in patent document 1, Japanese Patent Application Laid-Open No. 2003-170625). FIG. 25 shows a principle chart of the optical printer comprising the optical writing head. A light-conductive material (photosensitive material), such as amorphous Si, is formed on the surface of the cylindrical photosensitive drum 102. This cylindrical photosensitive drum 102 rotates at the printing speed. The whole surface of the cylindrical photosensitive drum 102 is evenly charged by means of a charging device 104 while rotating. Then, the light corresponding to the dot images for printing is irradiated onto the photosensitive material by means of the optical writing head 100, and charged portions of the photosensitive material are neutralized by means of the irradiated light. Then, the toner is continuously applied on the photosensitive material with a developing device 106, depending on the state of the charge on the photosensitive material. Then, the toner is transferred on a transported paper 112 by a transfer device 108. The transported paper 112 is heated and fixed with an electro-photographic fixing device 114, and then conveyed to a stacker 116. After the transfer is ended, the charged portions of the photosensitive material are neutralized over the entire surface of the cylindrical photosensitive drum 302 by means of an erasing lamp 118, and the remaining toner on the cylindrical photosensitive drum 302 is removed by means of a cleaning device 120.

In addition, a principle chart of the facsimile or the electro-photographic apparatus comprising the optical writing head is shown in FIG. 26. Like reference numeral is given with respect to the similar components shown in FIG. 25.

Light from a light source 124 is irradiated into a document 122 to be read being transported by a paper feeding roller 130, and the reflected light therefrom is received at an image sensor 128 through a focusing lens 126. Light of the light-emitting elements on light-emitting element array substrate 60 of optical writing head 100 is irradiated into the photosensitive drum 102 through a rod lens array 74 by the printing or copying function of the facsimile or the copying function of the electro-photographic apparatus. The printing operation to paper 112 is similar to the above optical printer.

FIG. 24 shows a typical structural chart of the optical writing head in the prior art. FIG. 24 is a cross-sectional view of a orthogonal direction with respect to the main scanning direction (hereafter, it is called the sub-scanning direction) of the optical writing head provided in the optical printer. A plurality of light-emitting element array chips 80, in which the light-emitting elements are linearly arranged, are mounted on a light-emitting element array substrate 60 in the main scanning direction, and the longer rod lens array 74 of an erecting unit magnification system in the main scanning direction is arranged on the optical path of the light emitted by the light-emitting element of the light-emitting element array chips 80. The rod lens array 74 is fixed with a housing 63 that has the function as the adjustment mechanism aligning the direction of an optical axis. The light emitted from the light-emitting element is focused on the photosensitive drum 102 through the optical rod lens array 74. In addition, a heat sink 65 for discharging the heat of the light-emitting element array chips 80 is provided into the bottom of the light-emitting element array substrate 60, and the housing 63 and the heat sink 65 are fixed with a detent device 66 placing the light-emitting element array substrate 60 between them. A typical structure of such an optical writing head is disclosed as a prior art (for example, in patent document 2, Japanese Patent Application Laid-Open No. 2004-209703).

FIG. 21 is a plan view in state of the micro-lenses arranged on one light-emitting element array chip. The light-emitting elements are linearly arranged along the edge of the chip. Such light-emitting element array chip 80 are shown in FIG. 21. Bonding pads 82 are arranged at both ends of the chip, and the light-emitting elements 84 of the light-emitting element array are linearly arranged along the edge of the chip. FIG. 22 shows an enlarged plan view in state of the micro-lenses arranged on one light-emitting element array chip, and shows the state in which the micro-lens 30c (called a spherical lens for lens having a spherical shape) is sequentially arranged on the light-emitting element with respect to the light-emitting element array. This enlarged part corresponds to the part enclosed with the dotted line of FIG. 21. FIG. 23 is a side view of FIG. 22. Such a micro-lens and the light-emitting element array is disclosed as a prior art (for example, in patent document 3, Japanese Patent Application Laid-Open No. 2005-311269).

Moreover, the technique that provides the self-scanning function with respect to the light-emitting intensity of the light-emitting element portion in the light-emitting element array while enabling the modulation of the light-emitting intensity of each light-emitting element portion is known as a prior art (for example, in patent document 4, Japanese Patent publication No. 2,577,089). Hereafter, the self-scanning light-emitting element array is called SLED (Self-scanning Light-Emitting Device). Similarly, the self-scanning light-emitting element array chip is called SLED chip.

For the light-emitting element with the micro-lens, as shown in FIG. 18A, a micro lens (a compound lens 30) is arranged on one light-emitting element having substantial u-shape that is composed of a light-emitting diode (LED) or a light-emitting thyristor. Details of the compound lens 30 are described later. When each maximum point of the light-emitting intensity of the substantial u-shaped light-emitting element portion is connected in the line, the broken line 32 is formed. For the compound lens 30, a portion of four spherical lenses that the center is located in each both ends or the neighborhood of three line segments of said broken line 32 is provided, and each portion of three cylindrical lenses that has parallel axis to each of the three line segments in the middle portion is provided, and each lens portion is mutually combined in adjacent arrangement thereby the compound lens 30 is formed.

FIG. 18B is a plan view showing the structure of the compound lens 30. Points 33, 34, 35, and 36 show each of both ends of three line segment 32a, 32b, and 32c of the u-shaped broken line 32 shown in FIG. 18A, respectively. The compound lens 30 includes a portion 43 of the spherical lens that centers on the point 33, a portion 44 of the spherical lens that centers on the point 34, a portion 45 of the spherical lens that centers on the point 35, and a portion 46 of the spherical lens that centers on the point 36. The compound lens 30 further includes a portion of the cylindrical lens 48 in addition that has a parallel axis to the line segment 32a, a portion of the cylindrical lens 50 that has a parallel axis to the line segment 32b, and a portion of the cylindrical lens 52 that has a parallel axis to the line segment 32c. For the compound lens 30, each portion of these four spherical lenses and these three cylindrical lenses is mutually combined in adjacent arrangement as shown in the FIG. 18B.

To understand the shape of the compound lens, the cross-sectional view of X-X' line and the cross-sectional view of Y-Y' line are also shown in FIG. 18B.

The compound lens 30 is a lens of special shape being combined each portion of the spherical lenses with each portion of the cylindrical lenses, each optical axis center of the spherical lenses or each center axis of the cylindrical lenses being adapted to each portion of the substantial u-shaped light-emitting element portion 84.

Using such a compound lens adapted to the substantial u-shaped light-emitting element enables to refract the light-emitting ray into the direction of optical axis, i.e. the direction along the rod lens, by using each portion of the compound lens for each portion of the substantial u-shaped light-emitting element portion, and thereby to narrow the light-emitting directivity of the lambertian to the direction along the rod lens.

FIG. 19 shows the process of manufacturing the light-emitting element array with the micro-lens. Here, this process of manufacturing of the lens is assumed to form the compound lens shown in FIG. 18B.

First of all, as shown in FIG. 19(A), Cr film 202 is applied on a fused silica substrate 200, and then the array of an opening portions 204 is formed in the Cr film by the photo-lithography technique. The pitch of opening portions 204 corresponds to the resolution of the optical printer, and for example, if the resolution is 600 dpi, the pitch of opening portion 204 becomes 42.3 µm.

FIG. 20 is a plan view of the fused silica substrate with the Cr film that includes the patterning of such opening portion array. The shape of each opening portion 204 has substantial u-shaped as shown therein, and the length for one line at the shape is 16 µm, and 2 µm in width. The position of this opening portion has been almost matched to the position of maximum amount of light in the light-emitting area of the substantial u-shaped thyristor for the light-emitting element. If a general spherical lens will be formed, the opening portion may be merely an opening portion for a minute circle (this opening diameter becomes about 1 to 5 µm.).

Then, the fused silica substrate 200 with the Cr film is wet-etched by using HF to form concave portions 206 as shown in FIG. 19(B). Each shape of the concave portions corresponds to the shape of the compound lens in which the spherical lens and the cylindrical lens are closely combined as shown in FIG. 18B.

In FIG. 20, each of the ends and the corners of the substantial u-shape is presented by characters "a", "b", "c", and "d". The fused silica substrate is etched with isotropy. Therefore, the etching operation advances from the ends "a" and "d" and the corners "b" and "c" of the opening portion 204, hemispherically. Moreover, the etching operation advances from the middle between "a" and "b", the middle between "b" and "c", and the middle between "c" and "d", cylindrically.

Thereby, the concave shape corresponding to the shape of the compound lens, which is shown in FIG. 18B, may be formed.

Then, the Cr film 202 that comes to the surface by the etching is removed by using a sticking film (not shown). That is, the adhesive film is pasted on the Cr film 202, the Cr film 202 is broken by holding an elastic substrate thereto, and the adhesive film is peeled, thereby the Cr film in the etching portion is removed. FIG. 19(C) shows the state. This is used for the following processes as a stamper (a molding model) 208.

Then, a mold lubricant is coated to the surface of the stamper 208, and as shown in FIG. 19(D), by a dispenser a photoresist (ultraviolet rays) 210 is dropped without rolling the bubble, and the photoresist adheres. There is an epoxy material or an acrylic material as a kind of photoresist, and both can be used.

Then, a light-emitting element array wafer 212 that ends the formation process of the light-emitting thyristor is put on a photoresist 210 as shown in FIG. 19(E). A number of self-scanning type of light-emitting element array chips have been formed in the wafer 212. Bonding pad 82 is provided at both ends of the chip, and the (substantial u-shaped) light-emitting portion 84 of the light-emitting thyristor is linearly arranged along the edge part of the chip. Since the compound lens should be formed so as to fit with the shape (substantial u-shape) of the light-emitting portion of the light-emitting thyristor, the wafer 212 and the stamper 208 need to align precisely. For this purpose, the markings of the aligning is provided for each of the wafer 212 and the stamper 208, and these markings are used for the aligning. At this time, the remaining Cr film 202 is provided so as to face to bonding pad 82 of the chip.

The photoresist 210 and the wafer 212 are contacted, and then developed by putting pressure. Besides, the distance between the light-emitting thyristor surface and the upper surface of the lens is optimized by selecting the amount of the photoresist, the welding force, and the pressurizing time.

To stiffen the photoresist 210, the ultraviolence-light 214 of the energy 14000 mJ/cm$^2$ and the wavelength 300 to 400 nm is irradiated into the resin 210 through the stamper 208, and then the resin stiffens. The optimal value of the energy of the ultraviolet ray is different according to the resin used. A typical value of about 5000 to 20000 mJ/cm$^2$ is used.

The ultraviolet rays may be produced as parallel-beams by using silica glass for collimating of ultraviolet rays being irradiated from the irradiating-points of fiber bundle. This parallel-beams may be vertically directed and irradiated into the back side of the stamper 208.

As shown in FIG. 19(F), after mould release of the stamper, the non-stiffened resin (i.e., the part other than the removing parts of Cr film on the lens portions is not stiffened, since the remaining Cr film shields the resin from the ultraviolet rays) is washed and removed with the solvent. FIG. 19(G) shows the result. That is, the compound lens 30 is formed on light-emitting portion 84 of the light-emitting thyristor, and the bonding pads 82 are exposed.

The light-emitting element array in FIG. 18A, FIG. 18B, FIG. 19, and FIG. 20 and this manufacturing method are disclosed as a prior art (for example, in patent document 5, Japanese Patent Application Laid-Open No. 2005-39195).

Patent document 1: Japanese Patent Application Laid-Open No. 2003-170625

Patent document 2: Japanese Patent Application Laid-Open No. 2004-209703

Patent document 3: Japanese Patent Application Laid-Open No. 2005-311269

Patent document 4: Japanese Patent publication No. 2,577, 089

Patent document 5: Japanese Patent Application Laid-Open No. 2005-39195

DISCLOSURE OF THE INVENTION

Problems to be Solved by the Invention

FIG. 3 shows the dimensional drawing of the micro-lens actually formed by using the above-described prior art. In FIG. 3, the compound lens, which is composed of the length 20 μm of the array direction (called the main scanning direction) of the micro-lens and the length 20 μm of the sub-scanning direction, has been formed. This size of the light-emitting portion corresponds to 1200 dpi used for the optical printer etc. for which this light-emitting element array is provided. The focusing spot shape $84d_1$ on the photosensitive drum in this case is shown at the dotted line in this FIG. 3. The size of the focusing spot shape $84d_1$ becomes 18 μm in the main scanning direction and 18 μm in the sub-scanning direction. Total amount of light of the focusing spot on the photosensitive drum was increased by 1.5 times relative to the absence of the micro-lens.

Preferably, if further a lot of amount of light is irradiated into the photosensitive drum, i.e., if the amount of light on the focusing spot is increased, it enables to achieve the additional speed-up of the optical printer etc. Moreover, increasing amount of light enables the energy-saving of the light-emitting element, and the cost-saving due to reduction of the number of driving IC. Therefore, further increased amount of light becomes a problem.

On the other hand, the laser beam diameter for 1200 dpi of a so-called laser beam printer in which the laser beam is scanned with a polygon mirror etc. is generally 50 to 60 μm on the photosensitive drum. More particular, while the pixel pitch corresponding to 1200 dpi in the laser printer for 1200 dpi is 21.2 μm, and thereby the beam of bigger size (that is, it corresponds to the focusing spot diameter) has been used, in fact this bigger size beam is used for the laser beam printer for 1200 dpi by using any signal processing accordingly. Therefore, it is noticed that there is need of further increased amount of light rather than the focusing spot size.

Considering such a fact, it may assume that the size of the light-emitting elements can be enlarged in the sub-scanning direction as one approach, but this approach cannot solve the problem of the energy-saving since the bigger light-emitting element causes the increase of the driving current of the light-emitting elements. That is, the approach provides the increase of power consumption and the increase of the load of driving IC, and thereby becomes an obstruction of the cost-saving.

The object of the present invention is to provide a light-emitting element array with the improvement of the light-emitting efficiency and the improvement of the uneven amount of light to solve the above problem.

Means for Solving the Problem

A light-emitting element array in accordance with one aspect of the present invention comprises a light-emitting portion array consisting of a plurality of light-emitting portions linearly arranged in a main scanning direction, and a micro-lens formed on each of the light-emitting portions, wherein the micro-lens has a shape of the length of a sub-scanning direction different from the length of the main scanning direction, and the length of the sub-scanning direction is longer than the length of the main scanning direction, and is 3.5 times or less of the length of the main scanning direction.

Moreover, according to one aspect of the present invention, the micro-lens is formed on the basis of any one of a spherical lens, an oval lens, a longer oval lens and a compound lens, wherein the length of the sub-scanning direction is 1.5 times or more of the length of the main scanning direction. In addition, the length of the sub-scanning direction is preferably 3 times or less of the length of the main scanning direction.

Moreover, according to one aspect of the present invention, the centroid position of the spherical lens corresponding to the light-emitting portion is arranged to shift in sub-scanning direction from the center of the circumscribed circle of the light-emitting portion. Here, "the centroid position of a lens of micro-lenses" is defined as follows. If a simple spherical lens or spherical lens is provided for the micro-lens, the centroid position of the lens is defined as a center position of the spherical or aspherical shape. If the micro-lens is a homogeneous medium, the "centroid position" becomes the position of the center of gravity decided because of the shape and the thickness in each part, etc. For example, even if it is a compound lens shown in FIG. 6, the centroid position (Osp) of the center of gravity is similarly determined from the shape and the thickness in each part, etc., while it is described in detail in the embodiments. In addition, the "center of the circle where the light-emitting portion 84 is circumscribed" may be also defined. For example, in the prior art (for example, patent document 5), the center Op of the circle where the light-emitting portion 84 is circumscribed (Hereafter, it is called the circumscribed circle center) and the centroid position Osp of the micro-lens are matched (refer to FIG. 18A).

Moreover, according to one aspect of the present invention, the light-emitting element array includes a plurality of light-emitting element array chips to which each of the light-emitting element array chips is mutually arranged in a staggered manner, and each light-emitting element array chip includes on the surface of each chip a bonding pad, which feeds the power to the light-emitting portions through a wire, and a resin pattern. The resin pattern comprises the micro-lenses, and a resin surface located in the surrounding of the micro-lenses, and a stray-light prevention wall for preventing a light being entered from a light-emitting portion on one chip to the wire of the bonding pad on the other chip. As a result, the degree of the resin of the chip on the surface may be increased to facilitate washing the redundant resin compared with conventional one, and the difference of the amount of light, which difference may be caused by the redundant resin being adhered to the micro-lenses, may be decreased.

In particular, it becomes preferable that the area that both the stray-light prevention wall and the resin surface occupy is larger than the area that the micro-lenses occupy.

In addition, the stray-light prevention wall is preferably formed with the same shape as the lenticular or as the shape of the micro-lens. In particular, if the stray-light prevention wall is formed with the same shape as the shape of the micro-lens, creating of the resin pattern of the chip in the manufacturing process may be simplified.

THE EFFECT OF THE INVENTION

In accordance with the present invention, the light-emitting efficiency can be improved by increasing the size of the micro-lens formed on the light-emitting portion in the sub-scanning direction with the shape of the light-emitting portion maintained, and thereby the speed-up of the optical printer etc. may be achieved.

Moreover, the cost of the light-emitting element array with the micro-lens can be reduced because of the energy-saving of the light-emitting elements and the reduction of the number of the driving ICs.

Furthermore, the amount of light can be more increased by increasing the size of the micro-lens in the sub-scanning direction even within the range of the focusing spot diameter demanded by the optical printer etc., and a light-emitting element array with better transmission efficiency of the amount of light directed into photosensitive drum can be achieved without providing the increase of power consumption.

BEST MODE FOR CARRYING OUT THE INVENTION

A First Embodiment

Figure 3:
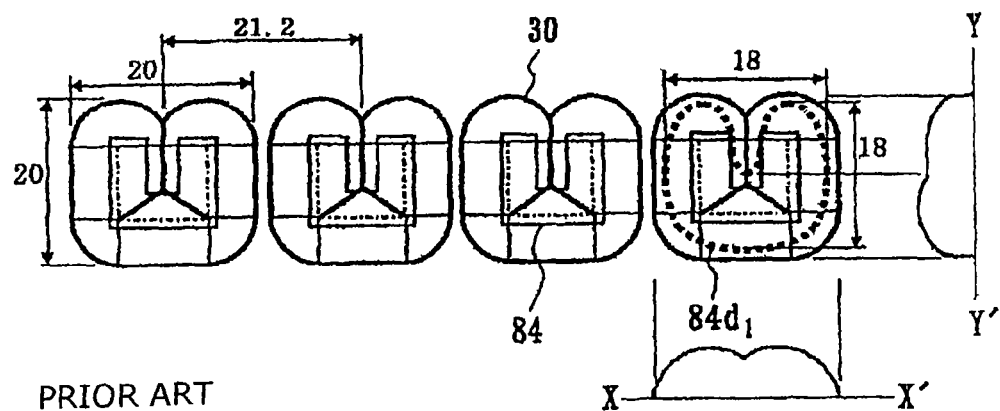
FIG. 3 is a view showing the size of the micro-lens actually formed using the prior art.

When a micro-lens of the length 20 μm in the array direction and the length 20 μm in the sub-scanning direction was formed on the basis of the prior art described referring to FIG. 3, total amount of light of the focusing spot on the photosensitive drum was increased by 1.5 times relative to the absence of the micro-lens.

On the other hand, amount of light may be more increased by increasing the size of a micro-lens arranged on the light-emitting portion in the sub-scanning direction according to a first embodiment.

Figure 19:
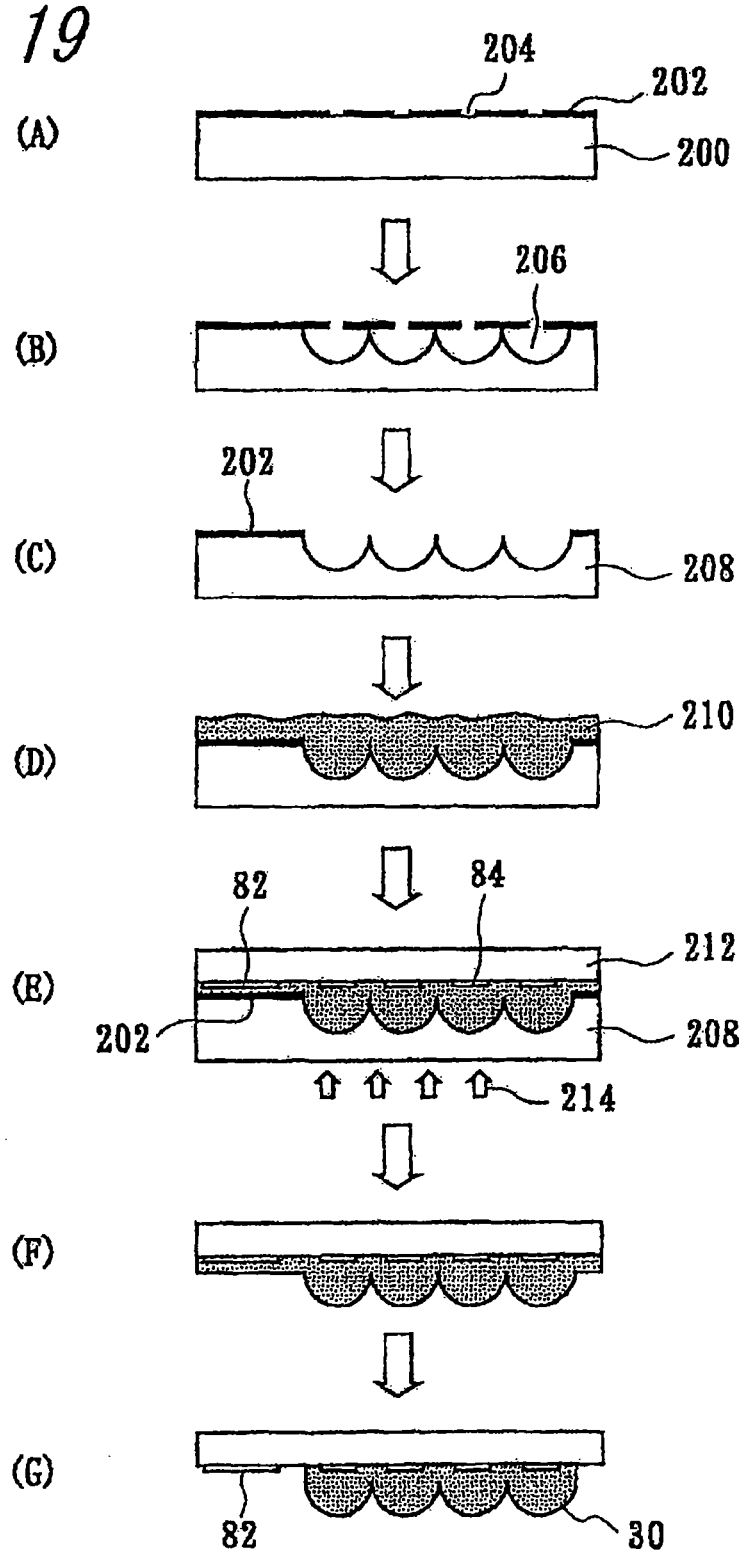
FIG. 19 is a view showing a manufacturing process of a light-emitting element array with a micro-lens.
Figure 20:
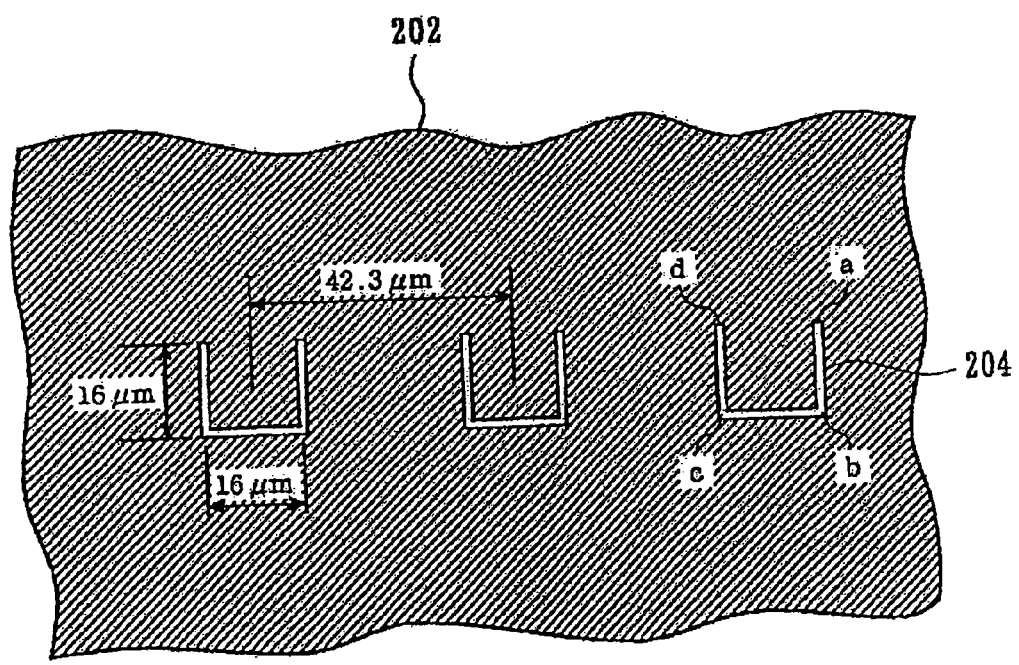
FIG. 20 is a plan view of a fused silica substrate with a Cr film that includes the patterning of such opening portion array.
Figure 21:
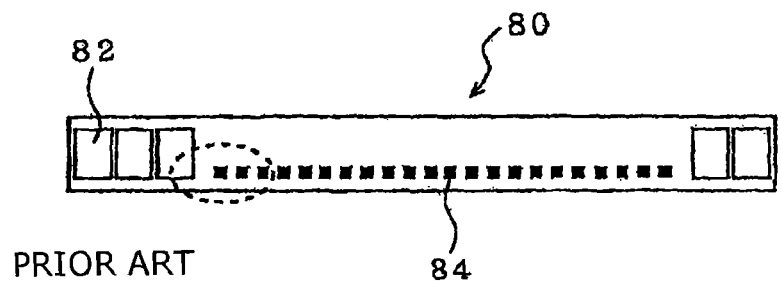
FIG. 21 is a plan view in state of micro-lenses arranged on one light-emitting element array chip.
Figure 22:
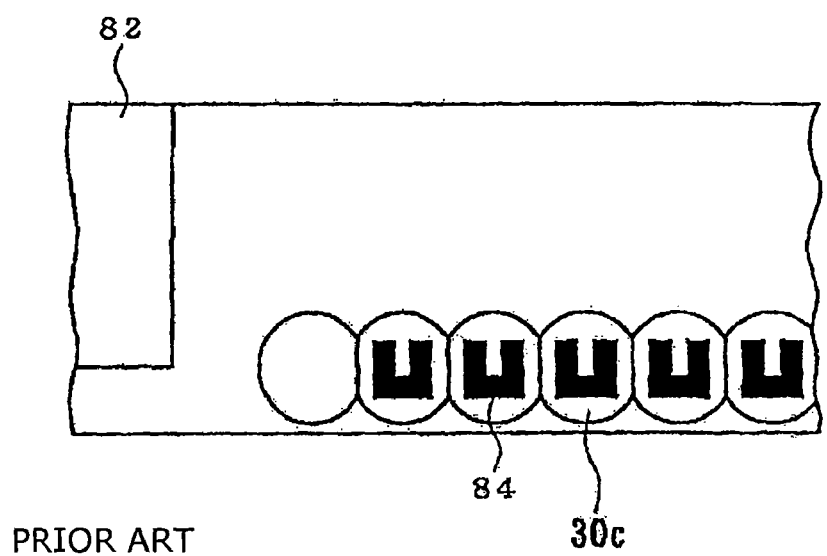
FIG. 22 is a view showing an example of a compound lens sequentially arranged on the light-emitting element with respect to the light-emitting element array.
Figure 23:
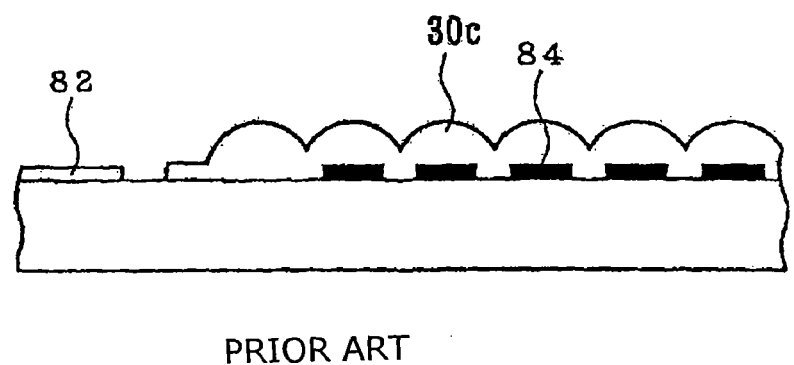
FIG. 23 is a side view showing an example of a compound lens sequentially arranged on the light-emitting element with respect to the light-emitting element array.
Figure 24:
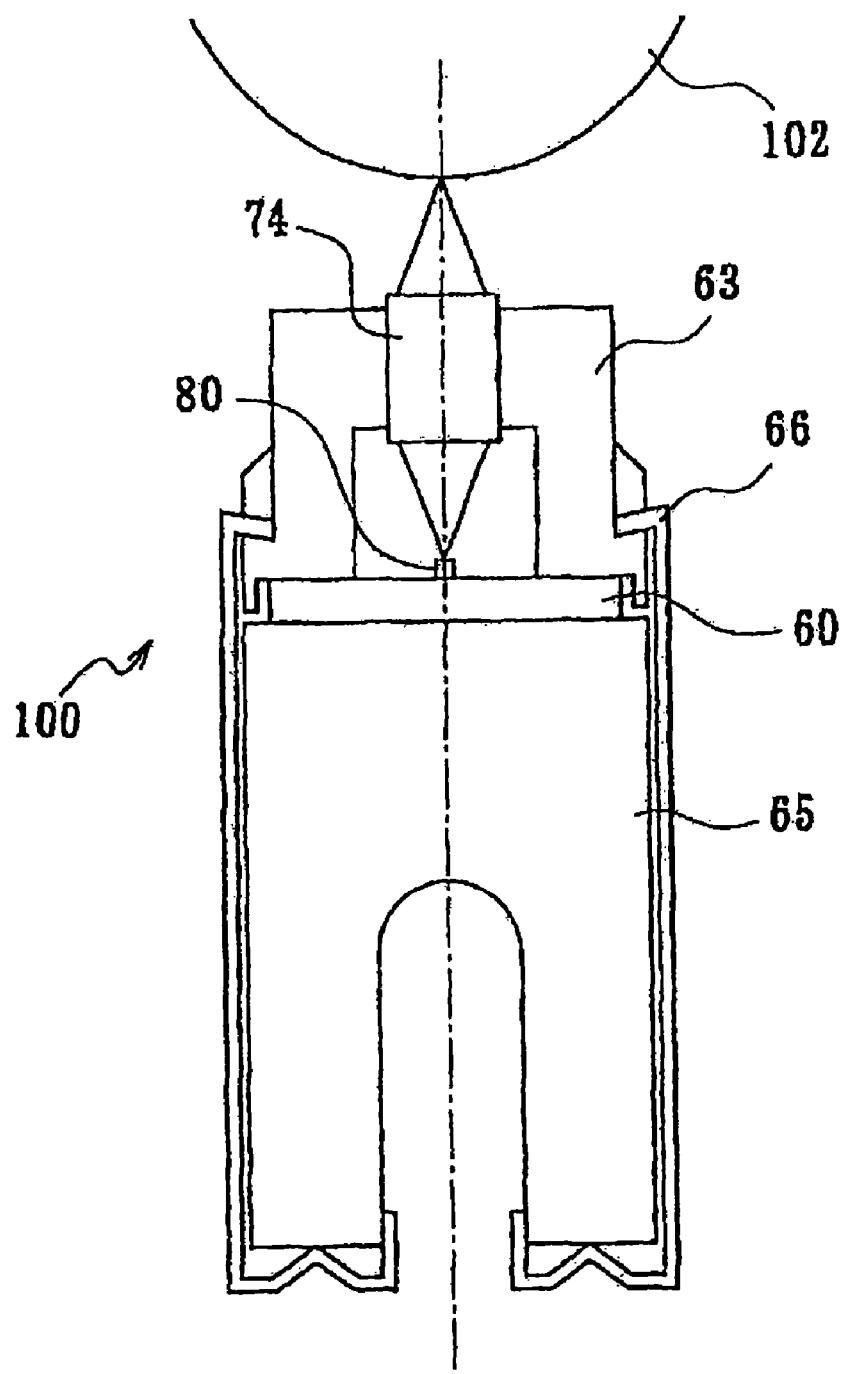
FIG. 24 is a typical structural chart of the optical writing head in the prior art.
Figure 25:
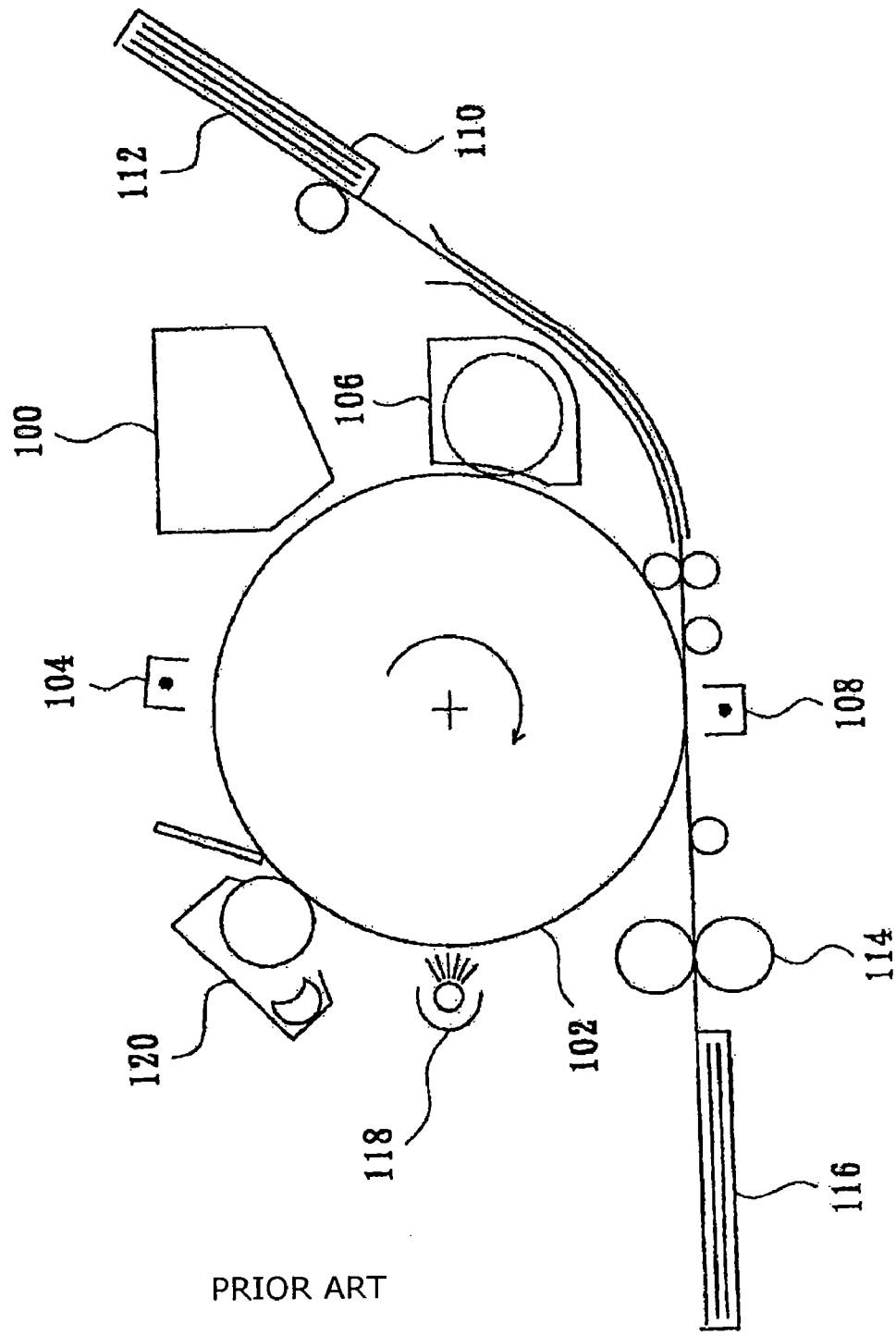
FIG. 25 is a principle chart of the optical printer comprising the optical writing head.
Figure 26:
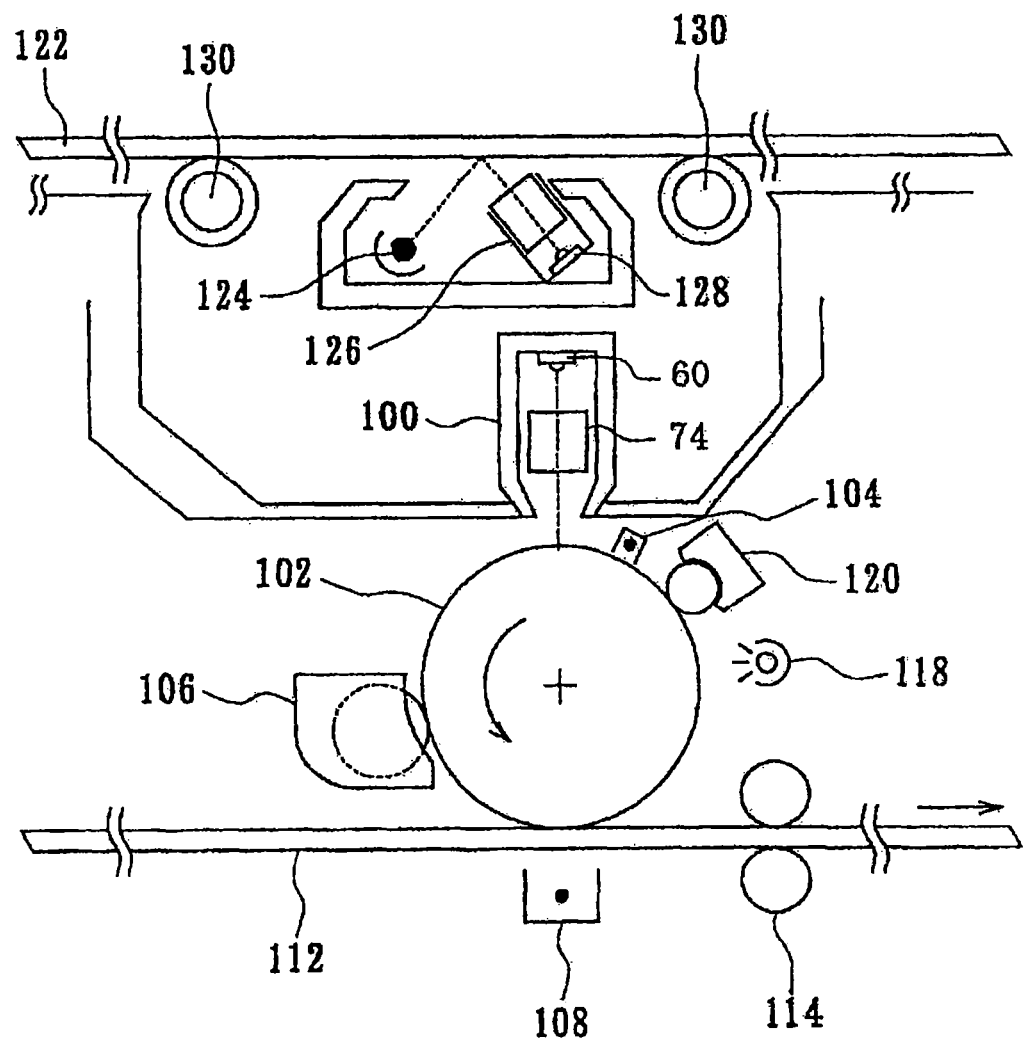
FIG. 26 is a principle chart of a facsimile or an electrophotographic apparatus comprising an optical writing head.

It is described as the method of increasing the size of a micro-lens in the sub-scanning direction as bellows. First, the shape of the mask opening for the photo-masking in the prior art described in FIG. 20 is used to create the lens original mold. Then, as described in FIG. 19(A), the Cr film is fixed on the fused silica substrate, and the patterning of the shape of the mask opening is done by using the photolithography technique, and then etched with HF. Then, after a predetermined etching time, the concave shape corresponding to the shape of compound lens 30 of FIG. 3 is obtained on the fused silica substrate 200. By providing this original mold to the forming of a lens according to the process described in FIG. 19, the compound lens described in FIG. 3 is obtained. The cross-sectional view of X-X' line and the cross-sectional view of Y-Y' line are shown in FIG. 3 to understand the shape of the compound lens 30.

After the predetermined etching time, the etching process is further continued according to a first embodiment. As a result, while each adjacent concave side of each micro-lens in the main scanning direction will come in contact mutually, the expanded concave shape in the sub-scanning direction rather than the main scanning direction is obtained on the fused silica substrate 200. By providing this expanded original mold to the forming of a lens according to the process described in FIG. 19, an expanded compound lens in the sub-scanning direction rather than the main scanning direction is obtained relative to the compound lens described in FIG. 3. The detailed shape size of the expanded compound lens is described later.

Figure 18A:
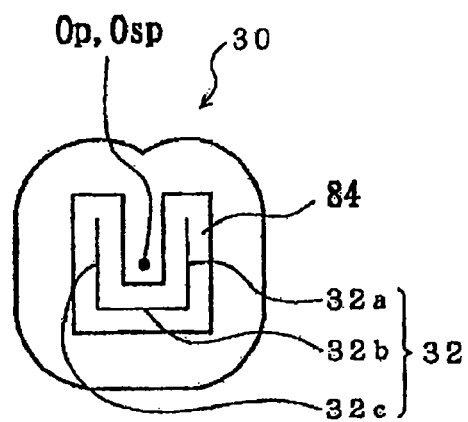
FIG. 18A is a view showing a compound lens formed on a light-emitting portion of a substantial u-shaped LED.
Figure 18B:
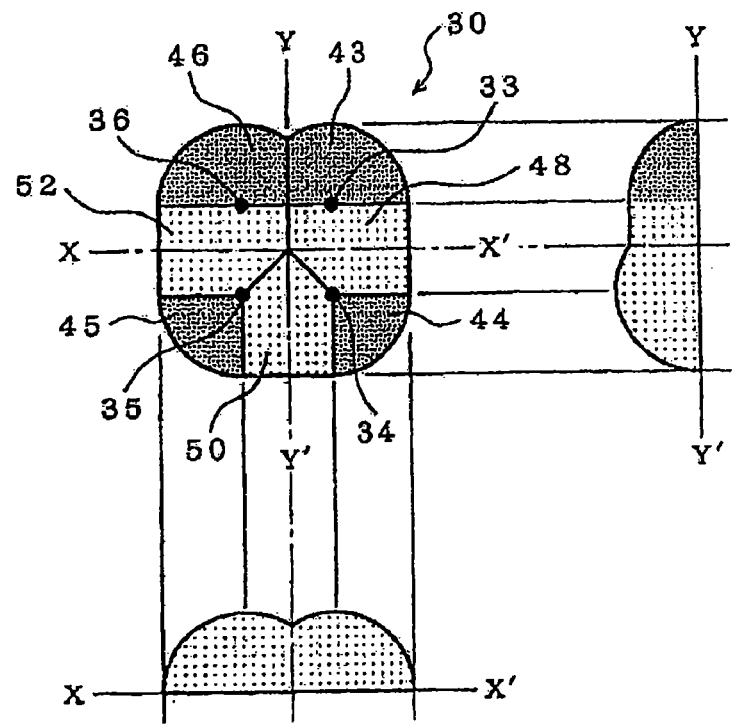
FIG. 18B is a plan view showing the structure of a compound lens.

Thus, plural kind of original molds for micro-lens may be formed from the same shape of the mask opening by changing the length of the etching time. Alternatively, the shape of the mask opening may be lengthened in the sub-scanning direction. Moreover, the relation of the distance and the position among three linear openings in substantial U-shaped mask-opening (that corresponds to 32a, 32b and 32c in FIG. 18A) may be changed.

Next, the detail shape size of a compound lens is described.

Figure 1:
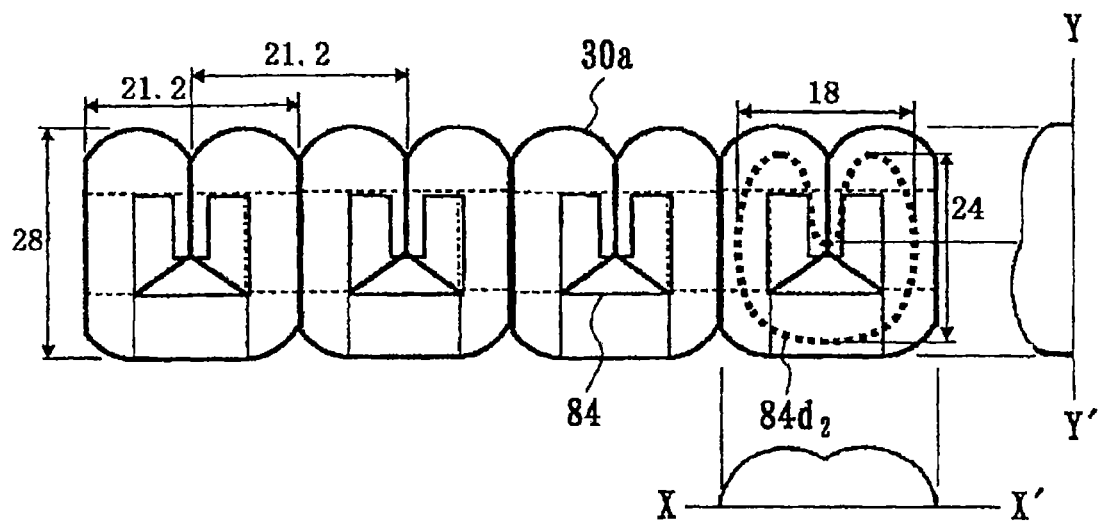
FIG. 1 is a view showing an example of a micro-lens formed on each light-emitting portion of a SLED chip for 1200 dpi.

FIG. 1 shows one example of the micro-lens formed on each light-emitting portion of the SLED chip for 1200 dpi (pitch 21.2 μm). The micro-lens in FIG. 1 was formed as the length 21.2 μm in the main scanning direction and the length 28 μm in the sub-scanning direction. The focusing spot shape 84$d_2$ in case of the optical writing head provided with this micro-lens is shown at the dotted line in FIG. 1. The total width 84$d_2$ of the focusing spot was the length 18 μm in the main scanning direction and the length 24 μm in the sub-scanning direction. The total amount of light of the focusing spot on the photosensitive drum were increased by 1.8 times relative to the absence of the micro-lens. To understand the shape of the compound lens 30a, the cross-sectional view of X-X' line and the cross-sectional view of Y-Y' line are also shown in FIG. 1. By forming a micro-lens according to the above-described process, the height of the micro-lens in X-X' line cross-sectional view and Y-Y' line cross-sectional view (FIG. 3) described by the prior art may be same as one of X-X' line cross-sectional view and Y-Y' line cross-sectional view (FIG. 1) of the first embodiment in the height direction (the vertical direction on the plan view shown in FIGS. 1 and 3) of the micro-lens.

As described above, the amount of light can be further increased suppressing the focusing spot diameter to 24 μm in the sub-scanning direction with respect to the beam diameter 50 μm of the laser beam printer in the prior art. That is, the amount of light can be increased maintaining actually higher resolution than the prior art. In addition, according to the above-described method of forming a micro-lens, such a micro-lens may be formed with comparative ease.

Therefore, in accordance with this embodiment, the light-emitting efficiency can be improved by increasing the size of the micro-lens formed on the light-emitting portion in the sub-scanning direction with the shape of the light-emitting portion maintained, and thereby the speed-up of the optical printer etc. may be achieved.

Moreover, the cost of the light-emitting element array with the micro-lens can be reduced because of the energy-saving of the light-emitting elements and the reduction of the number of the driving ICs. Furthermore, the amount of light can be more increased by increasing the size of the micro-lens in the sub-scanning direction even within the range of the focusing spot diameter demanded by the optical printer etc., and a light-emitting element array with better transmission efficiency of the amount of light directed into photosensitive drum can be achieved without providing the increase of power consumption.

A Second Embodiment

Figure 2:
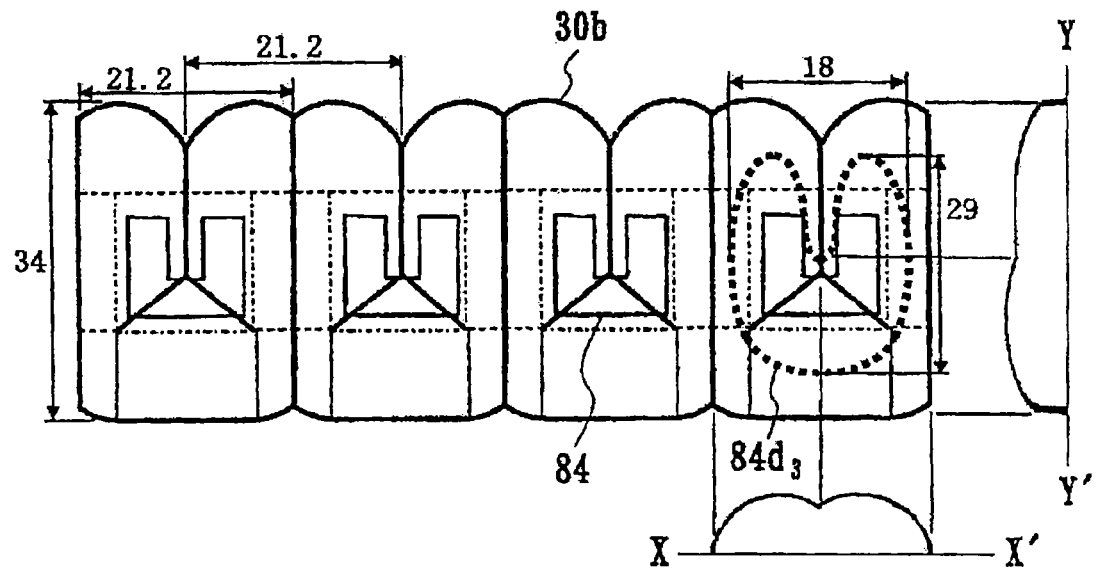
FIG. 2 is a view showing a further example of a micro-lens formed on each light-emitting portion of a SLED chip for 1200 dpi.

FIG. 2 shows one example of the micro-lens formed on each light-emitting portion of the SLED chip for 1200 dpi (pitch 21.2 μm). The micro-lens in FIG. 2 was formed as the length 21.2 μm in the main scanning direction and the length 34 μm in the sub-scanning direction. The focusing spot shape 84$d_3$ in case of the optical writing head provided with this micro-lens is shown at the dotted line in FIG. 2. The total width 84$d_3$ of the focusing spot was the length 18 μm in the main scanning direction and the length 29 μm in the sub-scanning direction. The total amount of light of the focusing spot on the photosensitive drum were increased by 2.1 times relative to the absence of the micro-lens. To understand the shape of the compound lens 30b, the cross-sectional view of X-X' line and the cross-sectional view of Y-Y' line are also shown in FIG. 2. By forming a micro-lens according to the above-described process, the height of the micro-lens in X-X' line cross-sectional view and Y-Y' line cross-sectional view (FIG. 3) described by the prior art may be same as one of X-X' line cross-sectional view and Y-Y' line cross-sectional view (FIG. 2) of the second embodiment in the height direction (the vertical direction on the plan view shown in FIGS. 2 and 3) of the micro-lens.

As described above, the amount of light can be further increased suppressing the focusing spot diameter to 29 μm in the sub-scanning direction with respect to the beam diameter 50 μm of the laser beam printer in the prior art. That is, the amount of light can be increased maintaining actually higher resolution than the prior art. In addition, according to the above-described method of forming a micro-lens such a micro-lens may be formed with comparative ease.

Therefore, in accordance with this embodiment, the light-emitting efficiency can be improved by increasing the size of the micro-lens formed on the light-emitting portion in the sub-scanning direction with the shape of the light-emitting portion maintained, and thereby the speed-up of the optical printer etc. may be achieved.

Moreover, the cost of the light-emitting element array with the micro-lens can be reduced because of the energy-saving of the light-emitting elements and the reduction of the number of the driving ICs. Furthermore, the amount of light can be more increased by increasing the size of the micro-lens in the sub-scanning direction even within the range of the focusing spot diameter demanded by the optical printer etc., and a light-emitting element array with better transmission efficiency of the amount of light directed into photosensitive drum can be achieved without providing the increase of power consumption It can be actually confirmed that the amount of light can improve by expanding the shape of the micro-lens into the sub-scanning direction in the first embodiment and the second embodiment. Then, the relation between the increase of the micro-lens shape in the sub-scanning direction and the increased amount of light has been analyzed by the simulation.

Figure 4:
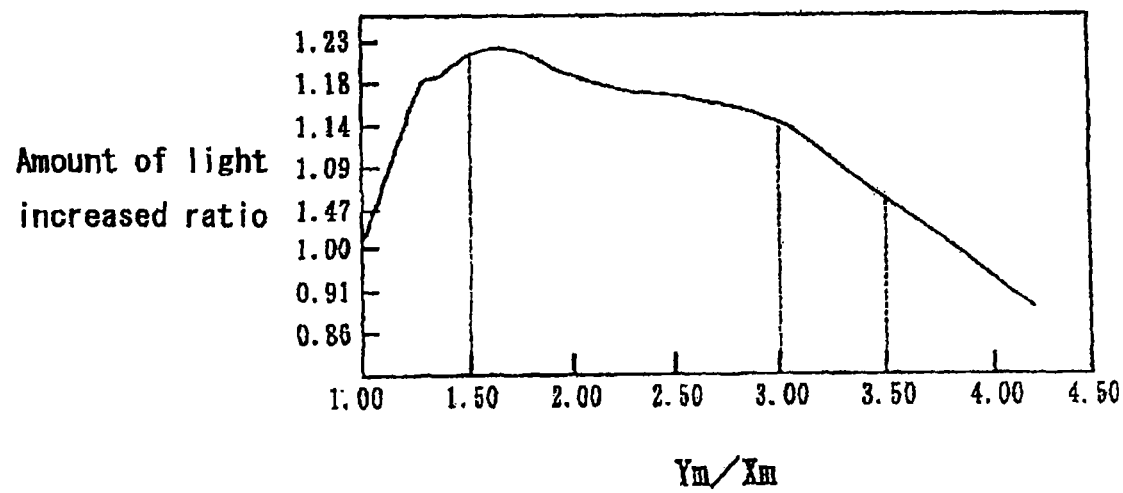
FIG. 4 is a view showing the simulation result of the relation between the increase of the shape of a micro-lens and the increased amount of light thereof.

FIG. 4 shows the simulation result of the relation between the increase of the micro-lens shape and the increased amount of light. In this simulation result shown, the light-emitting element array for 1200 dpi is assumed. The axis of abscissas is given at the ratio Ym/Xm, where Xm is representative of the length in the main scanning direction, and Ym is representative of the length in the sub-scanning direction Xm. In addition, the axis of ordinates is given at the ratio of amount of light corresponding to the focusing spot on the photosensitive drum as the ratio with reference to the value of the amount of light in Ym/Xm=1.0.

As the result of FIG. 4, for the shape size of the micro-lens, it has been understood that the amount of light surely improve relative to prior art (Ym/Xm=1.0), if the ratio (Ym/Xm) of the length Ym of the sub-scanning direction to the length Xm of the main scanning is a range of 1.5 to 3.0. In addition, as the result of FIG. 4, it is understood for the increased amount of light according to this technique that Ym/Xm>3.5 is undesirable based on the comparison consideration of an effect of the increased amount of light and the real resolution in the sub-scanning direction.

Moreover, the consistency of this simulation result is discussed referring to FIGS. 1 to 3. The micro-lenses shown in FIG. 3 corresponds to Ym/Xm=20/20=1.0, and the amount of light is improved by 1.5 times relative to the absence of the micro-lens. The micro-lenses shown in FIG. 1 corresponds to Ym/Xm=28.2/21.2=1.32, and the amount of light is improved by 1.8 times relative to the absence of the micro-lens. Therefore, the effect achieved according to the first embodiment is 1.8 times/1.5 times=1.2, and is very close to the simulation result (it is Ym/Xm=1.32, and the amount of light increased ratio is about 1.18) shown in FIG. 4. The micro-lenses shown in FIG. 2 corresponds to Ym/Xm=34.0/21.2=1.60, and the amount of light is improved by 2.1 times relative to the absence of the micro-lens. Therefore, the effect achieved according to the second embodiment is 2.1 times/1.5 times=1.4, and is more effect than the simulation result (it is Ym/Xm=1.60, and the amount of light increased ratio is about 1.22) shown in FIG. 4. Therefore, when the evaluating from this simulation as Ym/Xm is done, the dependable result of the increased amount of light of the micro-lens is obtained sufficiently.

From the result based on this simulation, the light-emitting efficiency can be improved by increasing the size of the micro-lens formed on the light-emitting portion in the sub-scanning direction with the shape of the light-emitting portion maintained, and thereby the speed-up of the optical printer etc. may be achieved.

Moreover, the cost of the light-emitting element array with the micro-lens can be reduced because of the energy-saving of the light-emitting elements and the reduction of the number of the driving ICs. Furthermore, the amount of light can be more increased by increasing the size of the micro-lens in the sub-scanning direction even within the range of the focusing spot diameter demanded by the optical printer etc., and a light-emitting element array with better transmission efficiency of the amount of light directed into photosensitive drum can be achieved without providing the increase of power consumption.

A Third Embodiment

Figure 5A:
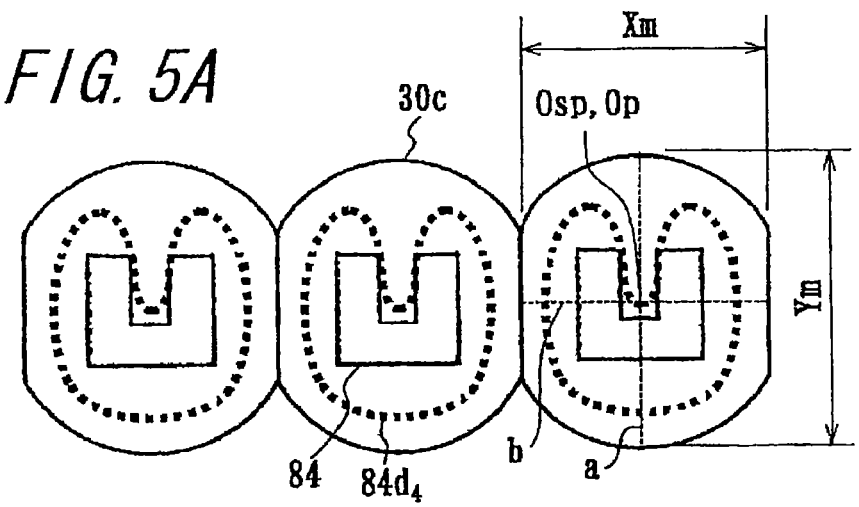
FIG. 5A is a plan view of a micro-lens in case of a spherical lens.
Figure 5B:
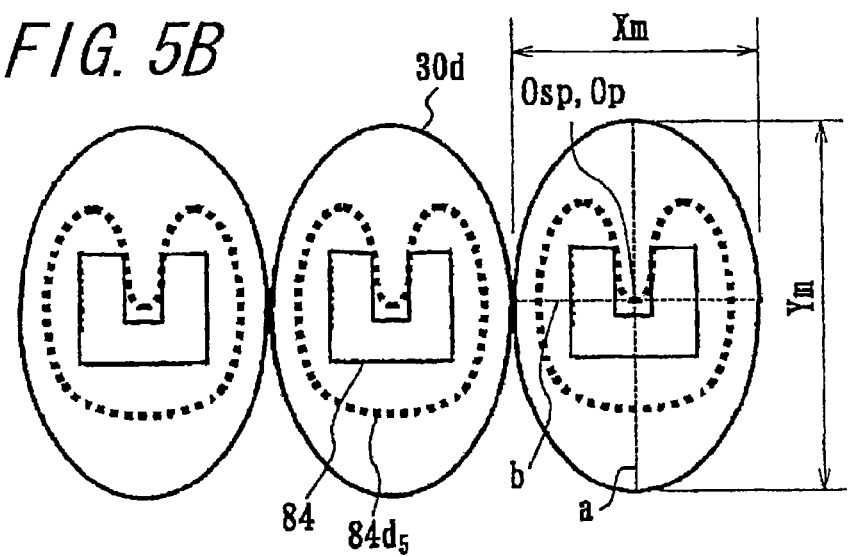
FIG. 5B is a plan view of a micro-lens in case of an oval lens.
Figure 5C:
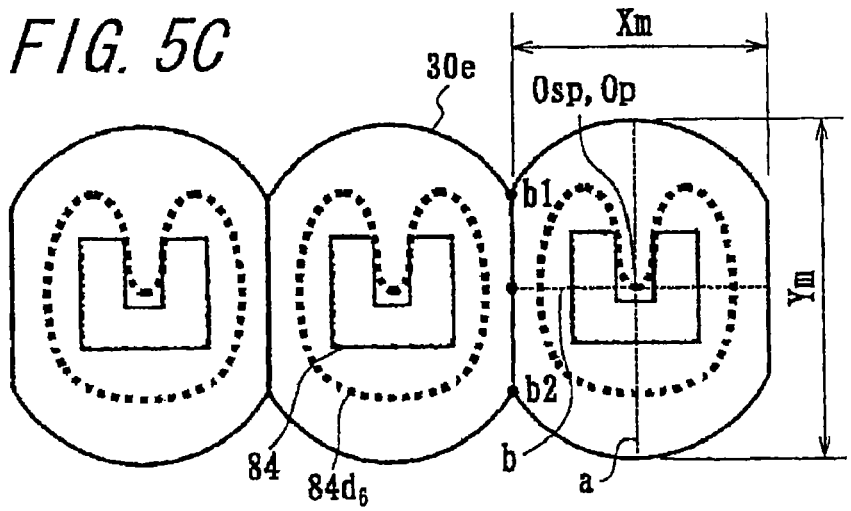
FIG. 5C is a plan view of a micro-lens in case of a longer oval lens with a cylindrical shape between two semicircular lenses.

The micro-lens of the compound lens has been described in the first and second embodiments. The shape of the etching mask of FIG. 20 can be changed to form the micro-lens of various shapes. FIGS. 5A to 5C show kinds of the shape of the micro-lens other than the compound lens. FIG. 5A is a plan view of a micro-lens in case of a spherical lens 30c, FIG. 5B is a plan view of a micro-lens in case of an oval lens 30d, and FIG. 5C is a plan view of a micro-lens in case of a longer oval lens 30e with a cylindrical shape between two semicircular lenses. For convenience, like reference numeral is given to a similar element in FIGS. 5A to 5C.

FIG. 5A shows a state in which the intersection (i.e., the lens centroid position Osp) of the sub-scanning direction axis "a" and the main scanning direction axis "b" is identical with the center Op of circumscribed circle of the light-emitting portion 84. Here, the contact part to the other adjoining spherical lenses 30c according to the formation method of the description in FIG. 19 is shown by the substantial straight line of the sub-scanning direction in the micro-lens plan view. Therefore, in the micro-lens in case of the spherical lens, the length Xm in the main scanning direction and length Ym in the sub-scanning direction of the micro-lens can be defined, and the effect of the present invention can be defined by Ym/Xm on the basis of the simulation result shown in FIG. 4. Here, if the contact part to the other adjoining micro-lenses doesn't exist, the length Xm in the main scanning direction can be defined by the maximum length of the main scanning direction in the micro-lens.

FIG. 5B shows a state in which the intersection (i.e., the lens centroid position Osp) of the sub-scanning direction axis (i.e., the longer axis) "a" and the main scanning direction axis (i.e., the shorter axis) "b" is identical with the center Op of circumscribed circle of the light-emitting portion 84. Here, the contact part to the other adjoining oval lenses 30d according to the formation method of the description in FIG. 19 is shown by the substantial straight line of the sub-scanning direction in the micro-lens plan view. Therefore, in the micro-lens in case of the oval lens, the length Xm in the main scanning direction and length Ym in the sub-scanning direction of the micro-lens can be defined, and the effect of the present invention can be defined by Ym/Xm on the basis of the simulation result shown in FIG. 4. Here, if the contact part to the other adjoining micro-lenses doesn't exist, the length Xm in the main scanning direction can be defined by the maximum length of the main scanning direction in the micro-lens.

FIG. 5C shows a state in which the intersection (i.e., the lens centroid position Osp) of the sub-scanning direction axis (i.e., the longer axis) "a" and the main scanning direction axis (i.e., the shorter axis) "b" is identical with the center Op of circumscribed circle of the light-emitting portion 84. Here, the cylindrical side (shown in "$b_1$-$b_2$") has been provided between the two semicircular lenses. The short axis "b" is a parallel axis to the sub-scanning direction, which passes the average (i.e., the middle point) of "$b_1$" and "$b_2$". Here, the contact part to the other adjoining longer oval lenses 30e according to the formation method of the description in FIG. 19 is shown by the substantial straight line of the sub-scanning direction in the micro-lens plan view. Therefore, in the micro-lens in case of the longer oval lens, the length Xm in the main scanning direction and length Ym in the sub-scanning direction of the micro-lens can be defined, and the effect of the present invention can be defined by Ym/Xm on the basis of the simulation result shown in FIG. 4.

In FIGS. 5A to 5C, each of the adjoining micro-lenses has the contact part to define as the length Xm of the main scanning direction, but if the contact part to the other adjoining micro-lenses doesn't exist, the length Xm in the main scanning direction can be defined by the maximum length of the main scanning direction in the micro-lens.

In FIGS. 5A to 5C, the focusing spot shape, $84d_4$, $84d_5$, and $84d_6$, on the photosensitive drum may be changed corresponding to the micro-lens shape, but the focusing spot shape doesn't have any problem since it only has to obtain the real resolution demanded in the design such as optical printers.

A Fourth Embodiment

In the first to third embodiments as shown in FIG. 5, it is described that the lens centroid position Osp of the micro-lens and the center Op of the circumscribed circle in the light-emitting portion are identical, but even if, for example, the lens centroid position Osp of the micro-lens is arranged to shift from the center Op of the circumscribed circle of the light-emitting portion in the sub-scanning direction, the effect similar to the first to third embodiments can be achieved.

Figure 6:
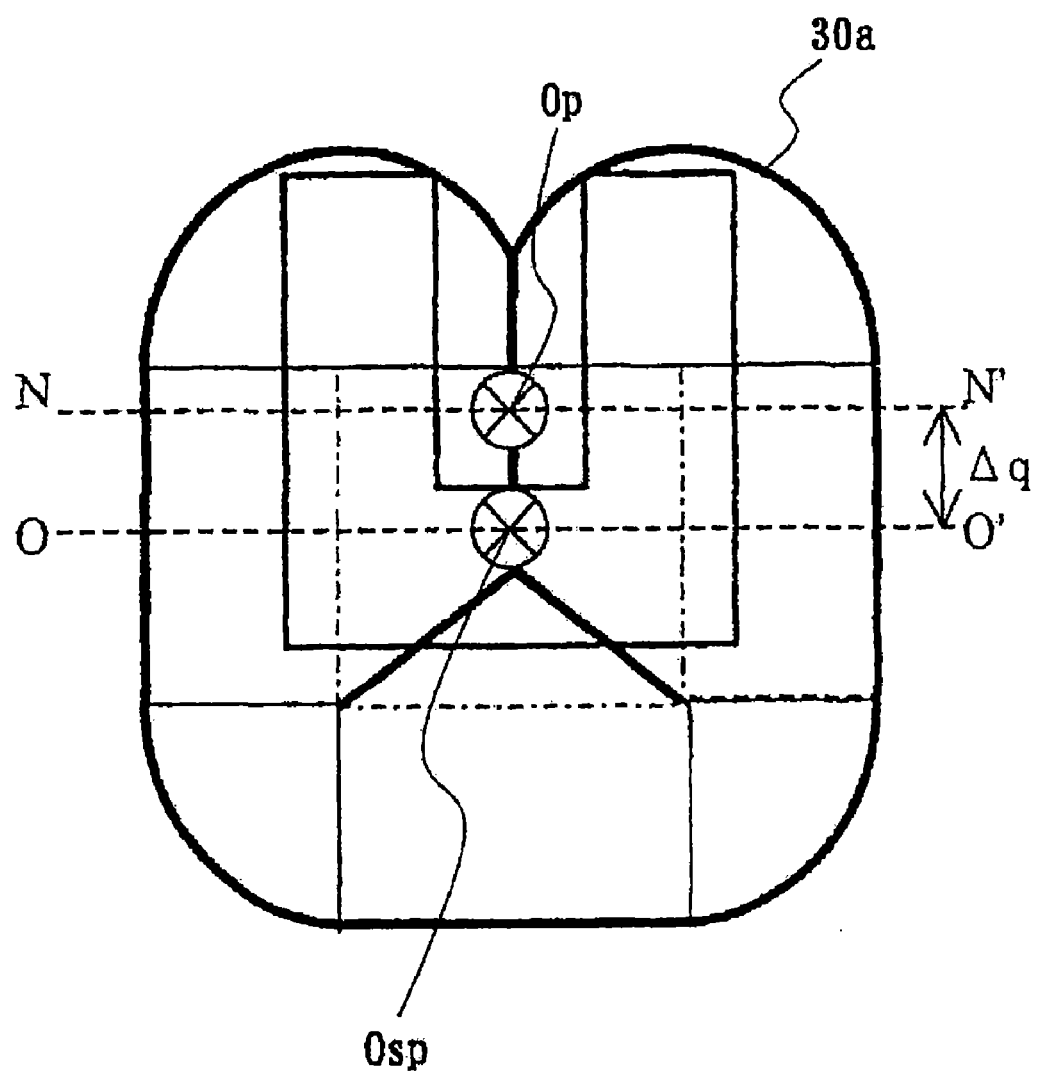
FIG. 6 is a view showing a light-emitting element array with a compound lens, in which the centroid position of such a micro-lens is arranged to shift from the center of the circumscribed circle of the light-emitting portion.

FIG. 6 is a view showing a light-emitting element array with a compound lens 30, in which the centroid position Osp of such a micro-lens 30a is arranged to shift from the center Op of the circumscribed circle of the light-emitting portion.

The line N-N' shows the axis in the sub-scanning direction that passes the center Op of the circumscribed circle in the light-emitting portion 84. Moreover, the line O-O' shows the axis in the sub-scanning direction that passes the lens centroid position Osp of the micro-lens. The distance between the line N-N' and the line O-O' has shifted only Δq as shown in FIG. 6. The light-emitting element array having the structure shown in FIG. 6 may be composed according to the formation method of the description in FIG. 19.

A Fifth Embodiment

Figure 7:
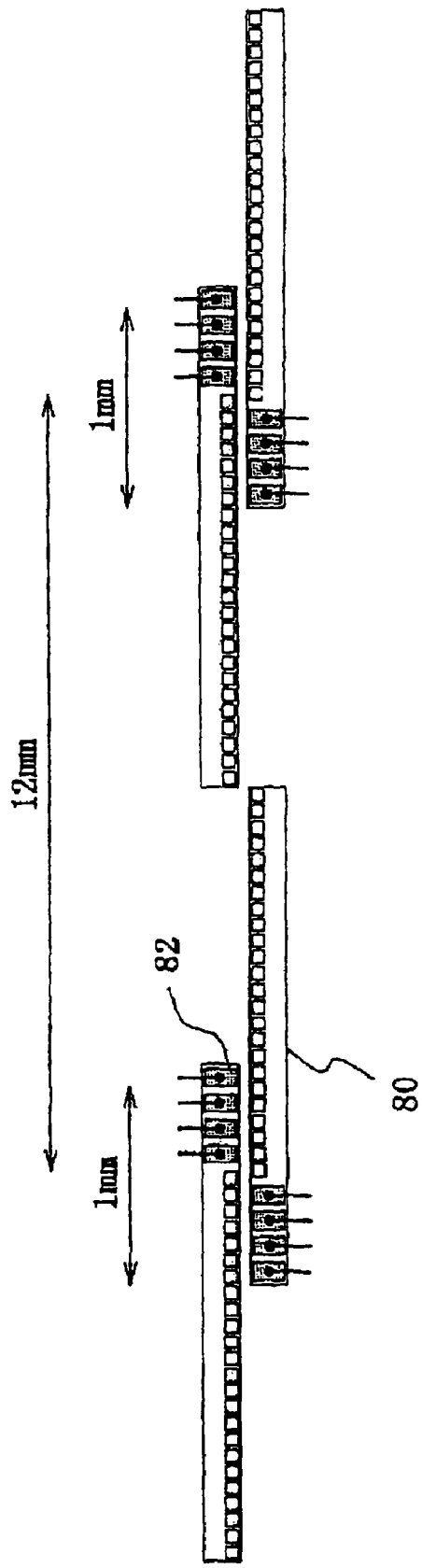
FIG. 7 is a view showing the staggered array type of a SLED chip.

The SLED chip 80 is arranged in staggered manner as shown in FIG. 7, and composes the light source of an optical writing head. In this manner of the light-emitting element array in which the SLED chip 80 is arranged in staggered manner, each edge of the chip overlaps in view of the main scanning direction (the array direction of the chips). For example, if the array distance of the bonding pad 82 per chip is 100 μm and the length of the chip is 6 mm, eight wires appear to swarm in the range of 1 mm at every 12 mm. This may appear to the printed image as an influence of the stray light. It is understood that such the stray-light has been caused chiefly by the reflection at the part of the height of 50 μm or more in the loop that wire 14 builds up, and the reflection at the surface of a ball portion 18 for the wire as described later.

Figure 8:
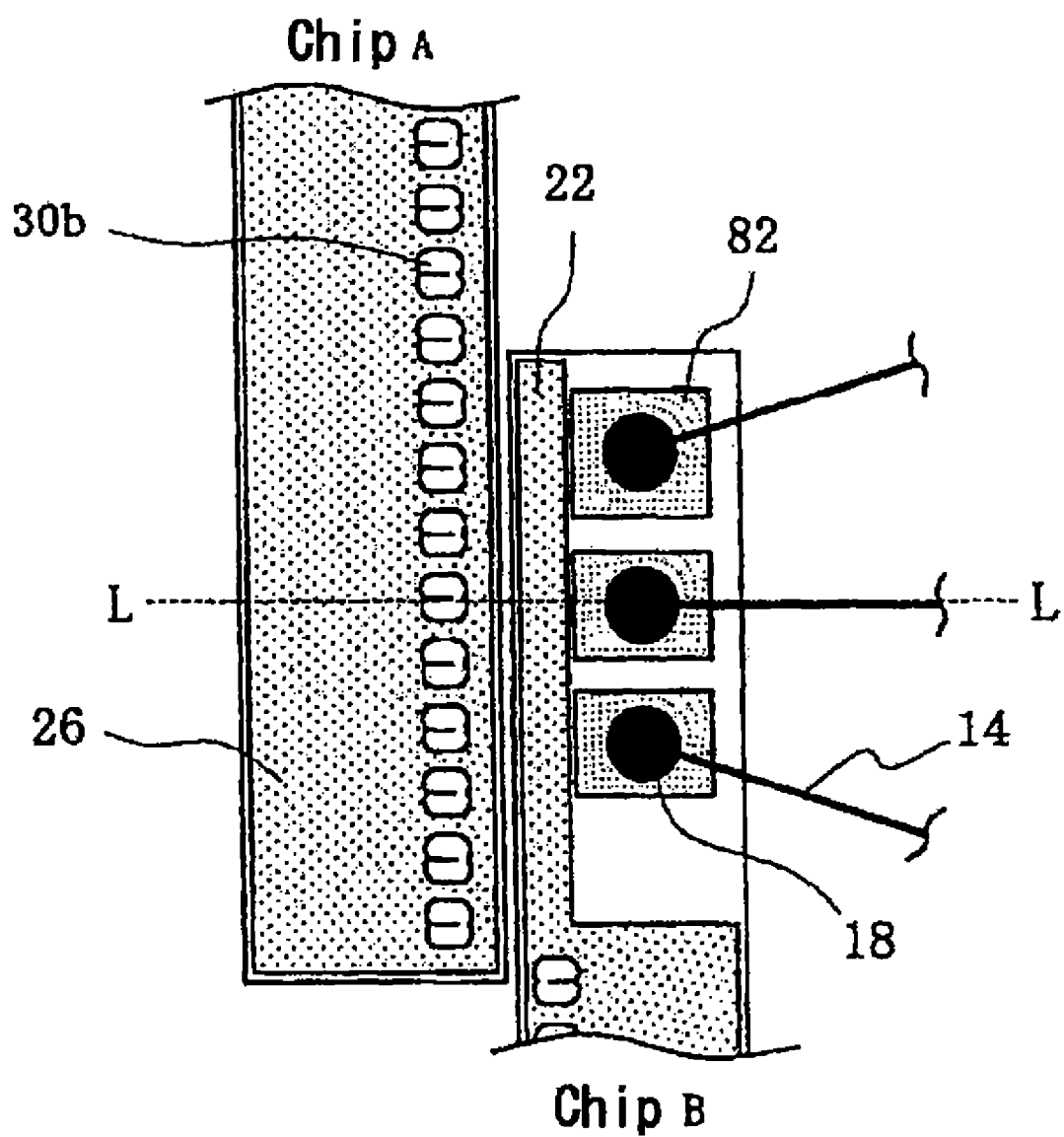
FIG. 8 is a view showing one embodiment of a light-emitting element array chip of the present invention.

Then, to prevent the influence of such stray-light, this embodiment provides a resin pattern comprising a stray-light prevention wall 22, micro-lenses 30b, and a resin surface 26, which consists of the same resin as the micro-lenses 30b, in all areas other than the bonding pad 82 and the micro-lenses 30b, as shown in FIG. 8. The manufacturing method of the resin pattern is as describing in FIG. 19. The side surface of the stray-light prevention wall 22 and the surface of the resin surface 26 has been a roughened surface. The shape of the micro-lens may be of any one described in the first to third embodiments.

Figure 9A:
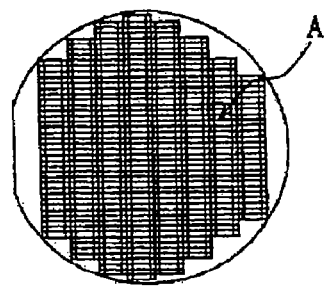
FIG. 9A is a schematic chart of a wafer on which light-emitting element array chips of one embodiment according to the present invention are formed.
Figure 9B:
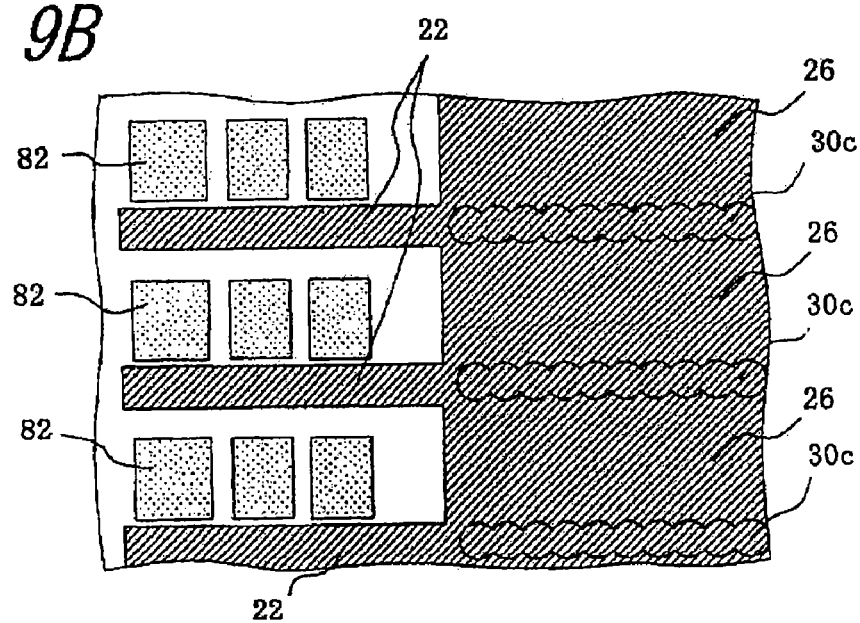
FIG. 9B is a view showing a light-emitting element array chip of one embodiment according to the present invention.

First, it is described that forming the resin surface in a surrounding part of the micro-lens and the micro-lens causes the advantageous effect, before the stray-light prevention wall is described. FIG. 9A is a schematic chart of a wafer on which SLED chips are formed. FIG. 9B is an enlarged view showing an example of the outline of a SLED chip in a part (indicated by "A") of FIG. 9A.

Figure 9C:
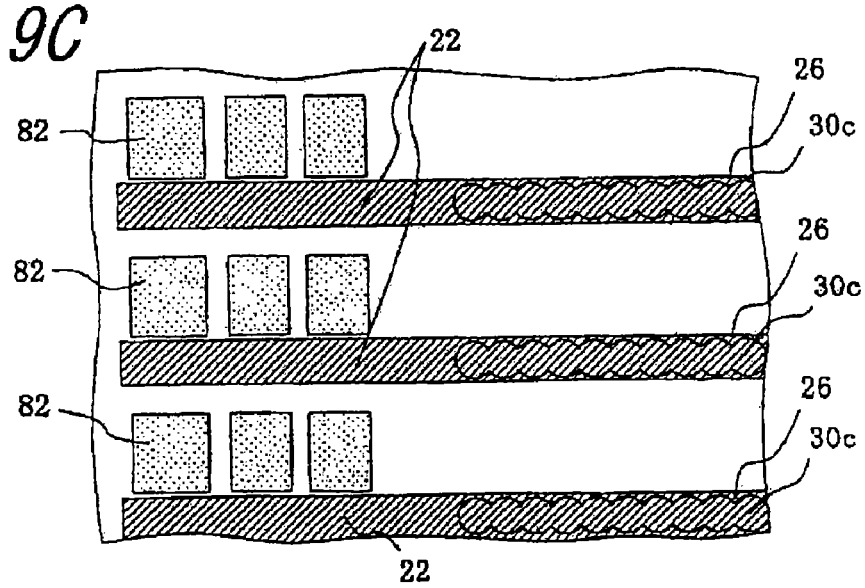
FIG. 9C is a view showing a light-emitting element array chip of one embodiment according to the present invention.

FIG. 9C is an enlarged view showing another example of the outline of a SLED chip of one embodiment according to the present invention in a part (indicated by "A") of FIG. 9A. In the description of this embodiment, a spherical lens 30c is typically shown in FIGS. 9B and 9C, but it may be an aspherical lens (30, 30a, 30b, 30d, or 30e).

In FIG. 9B, a stray-light prevention wall 22, micro-lenses 30c, and a resin surface 26 in the surrounding part of micro-lenses 30c are formed with the same photoresist, and the resin is not formed at bonding pad 82 and the surroundings thereof. In FIG. 9B, a stray-light prevention wall 22, micro-lenses 30c, and a resin surface 26 in the surrounding part of micro-lenses 30c are also formed with the same photoresist, and the resin is not formed at bonding pad 82 and the surroundings thereof. It is different for the area of the resin surface 26 of the surrounding part of the micro-lenses 30c in each SLED chip shown in FIG. 9B and FIG. 9C.

On the other hand, when the desired resin pattern is formed on the surface of the SLED chip, it is important that the remaining non-stiffened resin are surely removed. For example, if the non-stiffened resin remains on the bonding pad, it may cause conductive failure, and it may cause the uneven amount of light and the decreased rate of the amount of light for increase, if the non-stiffened resin attached remains on the micro-lenses 30c.

However, a careful washing adjustment is needed to surely remove the remaining of the non-stiffened resin that should be washed. In general, the non-stiffened resin will be removed by finely controlling the washing time (for example, the control of every minute). Therefore, making the area of the non-stiffened resin that should be washed on the SLED chip surface fewer becomes preferable to reduce the influence with the non-stiffened resin. That is, the area that should be washed in the SLED chip, shown in FIG. 9B, becomes fewer than the SLED chip shown in FIG. 9C in each SLED chip shown in FIG. 9B and FIG. 9C. Furthermore, the area that should be washed in the SLED chip, shown in FIG. 9C, becomes fewer than the SLED chip formed with only micro-lenses 30c (not shown). The fewer area that should be washed means the washed amount of the resin being fewer, and facilitating washing thereof.

Moreover, when each SLED chip shown in FIG. 9B and FIG. 9C was actually formed as three minutes in the washing time, it was confirmed that the SLED chip shown in FIG. 9B is improved by 30% as the uneven amount of light (PRNU) relative to the SLED chip shown in FIG. 9C. In other words, it was confirmed that the remaining of the non-stiffened resin facilitates to attach onto micro-lens 30c and that it cause the uneven amount of light, when the washing time was comparatively shortened. Therefore, the fewer area that should be washed causes the effect of shortening the time that should be washed, and decreasing the manufacturing cost.

To adjust the area that should be washed to at least ½ or less of the conventional area, the resin pattern in the SLED chip in the staggered manner comprises the micro-lenses 30c, and the resin surface located in the surrounding of the micro-lenses 30c, and a stray-light prevention wall 22 for preventing a light being entered from the light-emitting portion 84 on one chip to the wire 14 of the bonding pad 82 on the other chip. In particular, it becomes preferable that area that both the stray-light prevention wall 22 and the resin surface 26 occupy is larger than the area that the micro-lenses 30c occupy.

Figure 10:
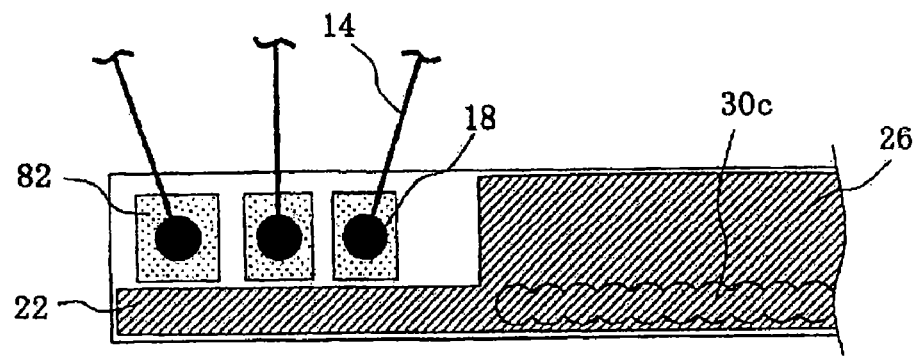
FIG. 10 is a view showing a light-emitting element array chip of one embodiment according to the present invention.

Then, the stray-light prevention wall 22 is formed with the resin, and some specific examples are described. FIG. 10 is a plan view in state of the stray-light prevention wall 22 on the surface of the SLED chip being formed with substantially identical to the height of the resin surface 26. Like reference numeral is given with respect to a similar component.

Figure 11:
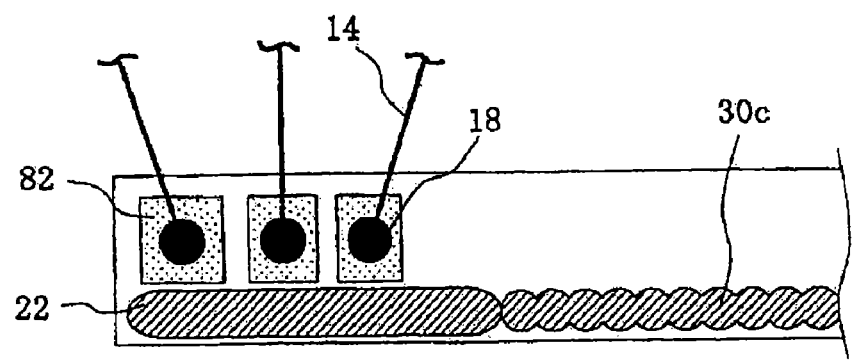
FIG. 11 is a view showing a light-emitting element array chip of one embodiment according to the present invention.
Figure 12:
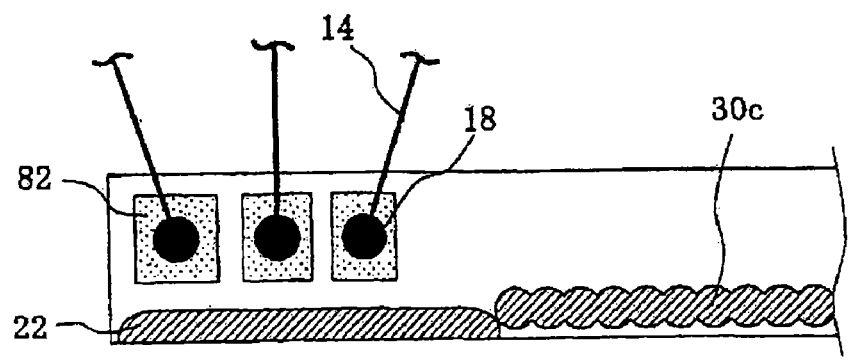
FIG. 12 is a view showing a light-emitting element array chip of one embodiment according to the present invention.

FIG. 11 shows an example of a dummy lens of lenticular type as the stray-light prevention wall 22, which is provided over the array of the micro-lenses 30c. Moreover, FIG. 12 shows an example of the dummy lens of lenticular type for the stray-light prevention wall 22, and the stray-light prevention wall 22 is formed by cutting the chip edge at position shifted from the array of the micro-lens 30c to the SLED chip edge (in the direction that becomes far from the region of the bonding pad 82). Thus, the height and the position of the stray-light prevention wall 22 can be preferably aligned by shifting from the array of the micro-lens 30c to the SLED chip-cutting axis the center axis of the main scanning direction, which is the top of a dummy lens of lenticular type. Such preferable height and position are clarified by the later explanations. It is preferable that the center axis of the main scanning direction, which is the top of a dummy lens of lenticular type (the stray-light prevention wall 22), is identical with the SLED chip-cutting axis in relation to FIG. 12.

Moreover, the SLED chip shown in FIG. 12 were actually formed, in which the height of a dummy lens of lenticular type (the stray-light prevention wall 22) is 25 μm and the roughness Ra of the chip cutting edge is 0.5 μm or more. It was confirmed that the stray light was not detected when the light-emitting element array in the staggered manner has been arranged by the stitch-bonding using this SLED chip.

Figure 13:
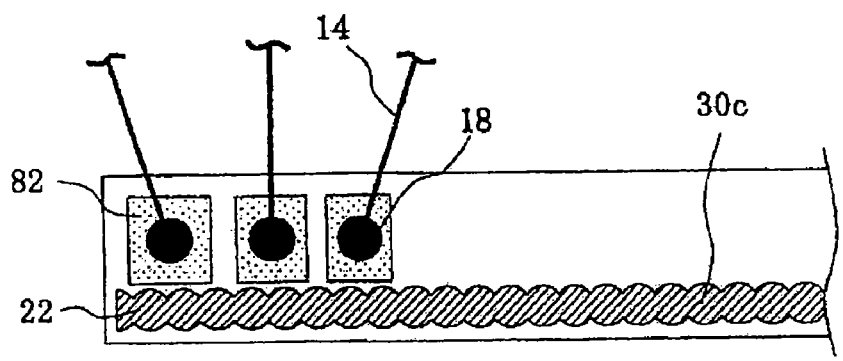
FIG. 13 is a view showing a light-emitting element array chip of one embodiment according to the present invention.
Figure 14:
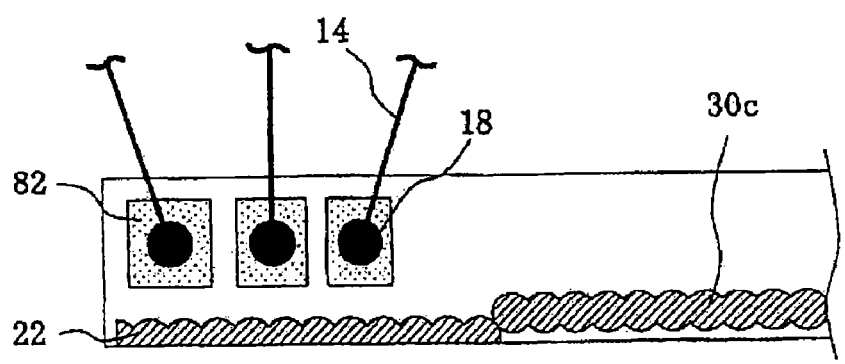
FIG. 14 is a view showing a light-emitting element array chip of one embodiment according to the present invention.

FIG. 13 shows an example of a dummy lens with the shape identical with the shape of the micro-lens as the stray-light prevention wall 22, which is provided over the array of the micro-lenses 30c. Moreover, FIG. 14 shows an example of a stray-light prevention wall 22 with the shape identical with the shape of the micro-lens, and the stray-light prevention wall 22 is formed by cutting the chip edge at position shifted from the array of the micro-lens 30c to the SLED chip edge (in the direction that becomes far from the region of the bonding pad 82). Thus, creating of the resin pattern in the manufacturing process can be simplified by providing the micro-lens shape rather than lenticular type with the stray-light prevention wall.

Figure 15:
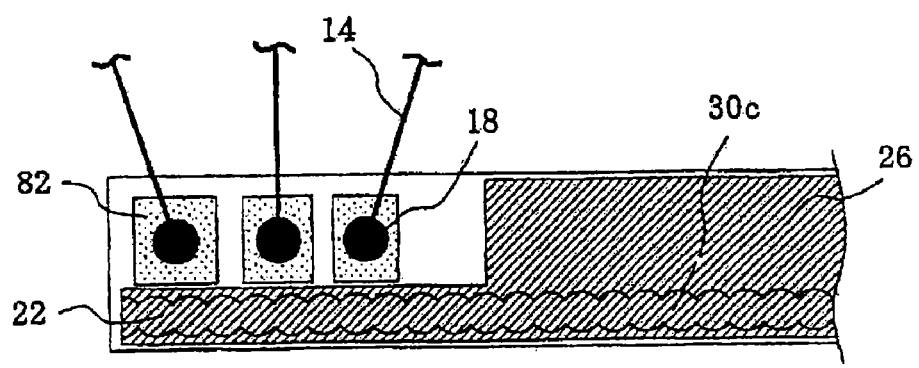
FIG. 15 is a view showing a light-emitting element array chip of one embodiment according to the present invention.

FIG. 15 shows an example of a dummy lens with the shape identical with the shape of the micro-lens as the stray-light prevention wall 22, which is provided over the array of the micro-lenses 30c, combined with the resin surface 26 in a surrounding part of the micro-lenses 30c.

Moreover, it should be understood to be able to create them as a variety of the modified examples from the examples shown in each of FIGS. 10 to 15. In FIGS. 10 to 15, the micro-lens 30c is typically shown as a spherical lens, but it may be an aspherical lens (i.e., a compound lens or an oval lens).

Figure 16A:
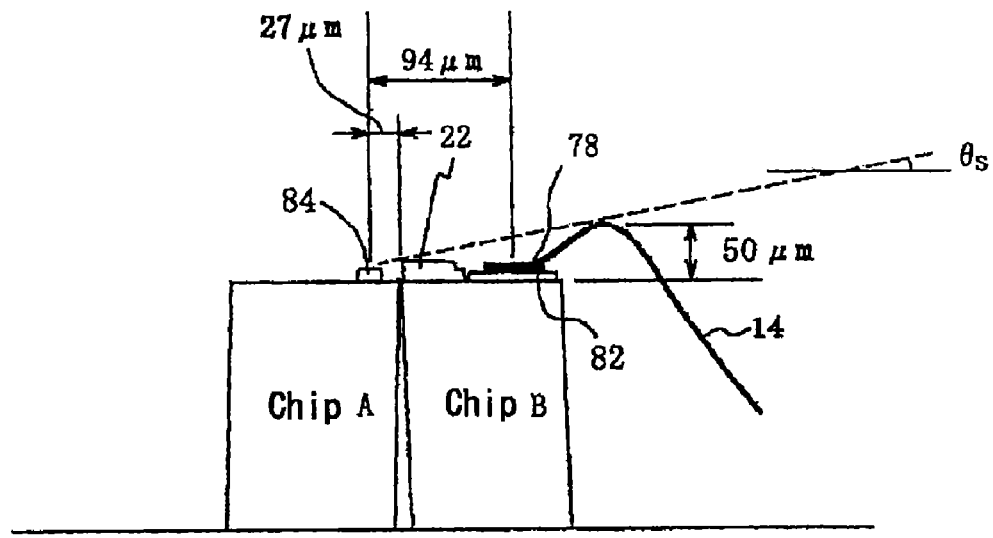
FIG. 16A is a view showing a light-emitting element array chip of one embodiment according to the present invention.

Next, it is now described how the height and the position of the stray-light prevention wall 22 are suitably aligned. FIG. 16A is a cross-sectional view showing one example of a light-emitting element array in staggered manner using the stitch-bonding 78. FIG. 16A is a cross-sectional view showing one example of a light-emitting element array in staggered manner using the ball-bonding 18. First, in case of the light-emitting element array in staggered manner, the main cause of the stray light often depends on the reflection of the ball or the bonding wire. Therefore, it is preferable that the stray-light prevention wall 22 is provided so that the light irradiated from the light-emitting portion 84 may never irradiate the bonding wire directly.

Figure 16B:
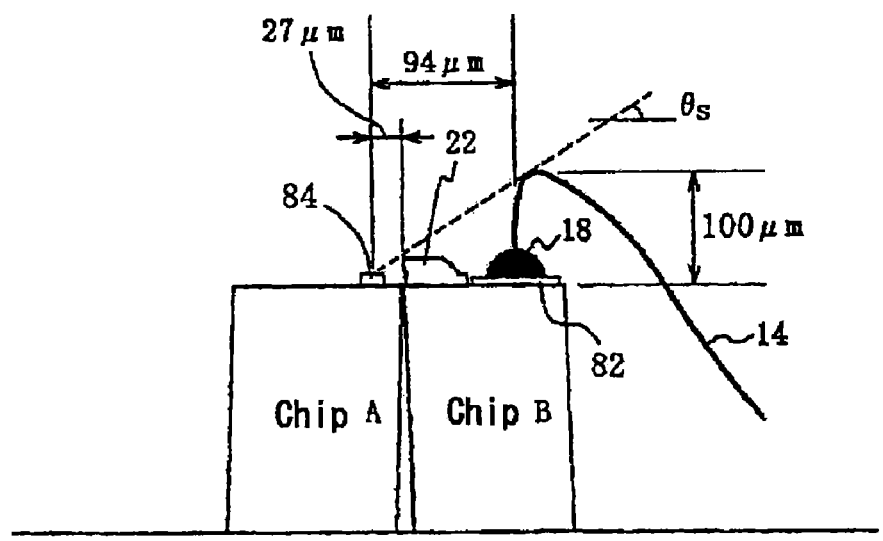
FIG. 16B is a view showing a light-emitting element array chip of one embodiment according to the present invention.

Each SLED chip shown in FIG. 16A and FIG. 16B is an example (refer to FIG. 8) in which each SLED chip is mutually faced, and has the pitch of the distance 42.3 µm of 2 times of the pitch of the light-emitting portions, so as to be, for example, 1200 dpi (about 21.16 µm) in the main scanning direction. The distance of the light-emitting portion between the mutually facing SLED chips is a value demanded in the design of an image-writing apparatus etc., used the light-emitting element array, and is generally the integral multiples to the pitch of the light-emitting portion in the main scanning direction. In this case, the distance from the SLED chip edge to the center of the light-emitting portion becomes 27 µm as shown in FIG. 16A and FIG. 16B. The height of the bonding wire is defined as the height needed to the arrangement of the light-emitting element array, while the height is illustrated at 50 µm in FIG. 16A and at 100 µm in FIG. 16B. For the stitch-bonding (FIG. 16A), the height of 15 µm or more becomes preferable for the stray-light prevention wall 22, and for the ball-bonding (FIG. 16B), the height of 30 µm or more becomes preferable for the stray-light prevention wall 22.

Figure 17:
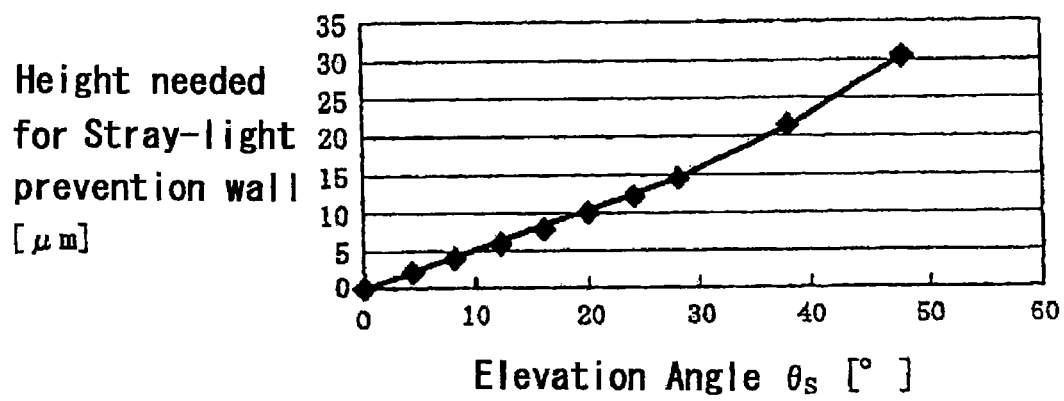
FIG. 17 is a view showing the relation between the angle to look up at the bonding wire from a light-emitting portion and the height of a stray-light prevention wall.

Therefore, the height needed for the stray-light prevention wall 22 may be determined according to the angle (an elevation angle θs) of looking up the bonding wire from the light-emitting portion, when a predetermined value has been demanded as a distance of the light-emitting portion of the mutually facing SLED chip as shown in FIG. 17. Thus, the molding to provide the resin pattern in the SLED chip can be formed extremely easily.

It should be understood that a lot of variations and modifications is able to be implemented by the skilled person in the art in the spirit or scope of the present invention, while the specific examples are described in the above-described embodiments. For example, a spherical lens, an oval lens, and a longer oval lens described in FIG. 5 may be achieved in similar manner, while a compound lens has been described in FIG. 6. Accordingly, the present invention is not to be considered as limited by the foregoing description but is only limited by the scope of the appended claims.

INDUSTRIAL APPLICABILITY

In accordance with the present invention, the light-emitting efficiency can be improved by increasing the size of the micro-lens formed on the light-emitting portion in the sub-scanning direction with the shape of the light-emitting portion maintained. Thereby, the present invention is useful for an optical printer, a facsimile, and an electro-photographic apparatus to speed up by using the optical writing head provided the light-emitting element array.

The invention claimed is:

1. A light-emitting element array, which has a structure in which a plurality of light-emitting element array chips are arranged in a staggered manner, comprising the plurality of light emitting element array chips each light emitting element array chip including:
   a light-emitting portion array consisting of a plurality of light-emitting portions linearly arranged in a main scanning direction; and
   a micro-lens array including a respective micro-lens formed on each of the light-emitting portions of the light emitting portion array,
   wherein each light-emitting element array chip has a surface including a bonding pad, which feeds power to the light-emitting portion array through a wire, and a resin pattern, and
   wherein the resin pattern comprises the micro-lenses, a resin surface surrounding the micro-lenses, and a stray-light prevention wall for preventing light from a light-emitting portion on one of the plurality of light emitting element array chips from being reflected by the wire of the bonding pad of another one of the plurality of light emitting element array chips.

2. A light-emitting element array according to claim 1, wherein an area of each of the plurality of light emitting array chips occupied by both the stray-light prevention wall and the resin surface is larger than an area occupied by the micro-lens array.

3. A light-emitting element array according to claim 1, wherein the stray-light prevention wall is formed with a shape selected from a group consisting of a lenticular lens shape or a shape that is the same as a portion of the micro-lens array.

4. A light-emitting element array according to claim 1, wherein the light-emitting portion array is a self-scanning light-emitting element array.

5. A light-emitting element array according to claim 1, wherein each light-emitting portion is selected from a group consisting of a light-emitting diode or a light-emitting thyristor.

6. An optical writing head comprising:

a light-emitting element array, that has a structure in which a plurality of light-emitting element array chips are arranged in a staggered manner, comprising the plurality of light emitting element array chips each light emitting element array chip including:

a light-emitting portion array consisting of a plurality of light-emitting portions linearly arranged in a main scanning direction; and a micro-lens array including a respective micro-lens formed on each of the light-emitting portions of the light emitting portion array, wherein each light-emitting element array chip has a surface including a bonding pad, which feeds power to the light-emitting portion array through a wire, and a resin pattern, and wherein the resin pattern comprises the micro-lenses, a resin surface surrounding the micro-lenses, and a stray-light prevention wall for preventing light from a light-emitting portion on one of the plurality of light emitting element array chips from being reflected by the wire of the bonding pad of another one of the plurality of light emitting element array chips.

7. An optical printer comprising:

an optical writing head including:

a light-emitting element array, that has a structure in which a plurality of light-emitting element array chips are arranged in a staggered manner, comprising the plurality of light emitting element array chips each light emitting element array chip including:

a light-emitting portion array consisting of a plurality of light-emitting portions linearly arranged in a main scanning direction; and a micro-lens array including a respective micro-lens formed on each of the light-emitting portions of the light emitting portion array, wherein each light-emitting element array chip has a surface including a bonding pad, which feeds power to the light-emitting portion array through a wire, and a resin pattern, and wherein the resin pattern comprises the micro-lenses, a resin surface surrounding the micro-lenses, and a stray-light prevention wall for preventing light from a light-emitting portion on one of the plurality of light emitting element array chips from being reflected by the wire of the bonding pad of another one of the plurality of light emitting element array chips.

8. A facsimile comprising:

an optical writing head including:

a light-emitting element array, that has a structure in which a plurality of light-emitting element array chips are arranged in a staggered manner, comprising the plurality of light emitting element array chips each light emitting element array chip including:

a light-emitting portion array consisting of a plurality of light-emitting portions linearly arranged in a main scanning direction; and a micro-lens array including a respective micro-lens formed on each of the light-emitting portions of the light emitting portion array, wherein each light-emitting element array chip has a surface including a bonding pad, which feeds power to the light-emitting portion array through a wire, and a resin pattern, and wherein the resin pattern comprises the micro-lenses, a resin surface surrounding the micro-lenses, and a stray-light prevention wall for preventing light from a light-emitting portion on one of the plurality of light emitting element array chips from being reflected by the wire of the bonding pad of another one of the plurality of light emitting element array chips.

9. An electro-photographic apparatus comprising:

an optical writing head including:

a light-emitting element array, that has a structure in which a plurality of light-emitting element array chips are arranged in a staggered manner, comprising the plurality of light emitting element array chips each light emitting element array chip including:

a light-emitting portion array consisting of a plurality of light-emitting portions linearly arranged in a main scanning direction; and a micro-lens array including a respective micro-lens formed on each of the light-emitting portions of the light emitting portion array, wherein each light-emitting element array chip has a surface including a bonding pad, which feeds power to the light-emitting portion array through a wire, and a resin pattern, and wherein the resin pattern comprises the micro-lenses, a resin surface surrounding the micro-lenses, and a stray-light prevention wall for preventing light from a light-emitting portion on one of the plurality of light emitting element array chips from being reflected by the wire of the bonding pad of another one of the plurality of light emitting element array chips.

* * * * *